US008232123B2

(12) United States Patent
Cho et al.

(10) Patent No.: US 8,232,123 B2
(45) Date of Patent: Jul. 31, 2012

(54) ORGANIC LIGHT EMITTING DIODE DISPLAY WITH IMPROVED ON-CURRENT, AND METHOD FOR MANUFACTURING THE SAME

(75) Inventors: Kyu-Sik Cho, Suwon-si (KR); Byoung-Seong Jeong, Yongin-si (KR); Joon-Hoo Choi, Seoul (KR); Jong-Moo Huh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 138 days.

(21) Appl. No.: 12/424,639

(22) Filed: Apr. 16, 2009

(65) Prior Publication Data

US 2009/0302319 A1 Dec. 10, 2009

(30) Foreign Application Priority Data

Jun. 4, 2008 (KR) ........................ 10-2008-0052539

(51) Int. Cl.
*H01L 21/336* (2006.01)

(52) U.S. Cl. .......... 438/34; 438/905; 438/906; 438/974; 257/82; 257/84; 257/88; 257/99; 257/257; 257/184

(58) Field of Classification Search ........... 257/E29.003, 257/E29.004, E29.105, 82, 84, 88, 99, 184, 257/257, E51.001; 438/905, 906, 974
See application file for complete search history.

(56) References Cited

U.S. PATENT DOCUMENTS

| | | | | |
|---|---|---|---|---|
| 5,759,879 | A * | 6/1998 | Iwasaki | 438/166 |
| 6,614,054 | B1 * | 9/2003 | Ahn | 257/72 |
| 7,465,677 | B2 * | 12/2008 | Isobe et al. | 438/772 |
| 2007/0145374 | A1 * | 6/2007 | Whangbo et al. | 257/72 |
| 2007/0188089 | A1 * | 8/2007 | Choi et al. | 313/506 |
| 2009/0166616 | A1 * | 7/2009 | Uchiyama | 257/43 |

* cited by examiner

*Primary Examiner* — Wai Sing Louie
*Assistant Examiner* — Bilkis Jahan
(74) *Attorney, Agent, or Firm* — Cantor Colburn LLP

(57) ABSTRACT

An organic light emitting device and a manufacturing method thereof, including a first signal line and a second signal line intersecting each other on an insulating substrate, a switching thin film transistor connected to the first signal line and the second signal line, a driving thin film transistor connected to the switching thin film transistor, and a light emitting diode ("LD") connected to the driving thin film transistor. The driving thin film transistor includes a driving control electrode and a driving semiconductor overlapping the driving control electrode, crystallized silicon having a doped region and a non-doped region, a driving gate insulating layer disposed between the driving control electrode and the driving semiconductor, and a driving input electrode and a driving output electrode opposite to each other on the driving semiconductor, wherein the interface between the driving gate insulating layer and the driving semiconductor includes nitrogen gas.

11 Claims, 27 Drawing Sheets

ORGANIC LIGHT EMITTING DIODE DISPLAY WITH IMPROVED ON-CURRENT, AND METHOD FOR MANUFACTURING THE SAME

This application claims priority to Korean Patent Application No. 10-2008-0052539, filed on Jun. 4, 2008, and all the benefits accruing therefrom under 35 U.S.C. §119, the contents of which in its entirety are herein incorporated by reference.

BACKGROUND OF THE INVENTION (a) Field of the Invention

This disclosure relates to an organic light emitting device and a manufacturing method thereof.

(b) Description of the Related Art

An organic light emitting device ("OLED") includes two electrodes and an organic light emitting layer interposed between the two electrodes. One of the two electrodes injects holes and the other injects electrons into the light emitting layer. The injected electrons and holes combine to form excitons, and the excitons emit light in a discharge process.

Because the organic light emitting device is a self-emissive display device, an additional light source can be omitted, enabling the organic light emitting device to have lower power consumption. The organic light emitting devices may be classified as a passive matrix organic light emitting device or an active matrix organic light emitting device.

In an active matrix OLED, an electrode and an emission layer are disposed on a thin film transistor array panel. The thin film transistor array panel in an active matrix OLED includes signal lines, switching thin film transistors electrically connected to the signal lines for controlling data voltages, and driving thin film transistors to flow electric current to a light-emitting device by applying the transmitted data voltages as gate voltages.

In an active matrix organic light emitting device, driving thin film transistors with high mobility and high stability are desired to enable sufficient flow of electric current. Therefore, to facilitate flow of sufficient electric current, it would be desirable for the driving thin film transistors to include a crystallized semiconductor, and it would be desirable for the crystallized semiconductor to have a large grain size and high uniformity.

BRIEF SUMMARY OF THE INVENTION

Accordingly, this disclosed OLED improves the characteristics of a thin film transistor and an organic light emitting device by improving the crystallinity of a semiconductor.

The above described and other drawbacks are alleviated by an organic light emitting device that includes a first signal line and a second signal line intersecting the first signal line, the first signal line and the second signal line deposited on an insulating substrate, a switching thin film transistor electrically connected to the first signal line and the second signal line, a driving thin film transistor electrically connected to the switching thin film transistor, and a light emitting diode ("LD") electrically connected to the driving thin film transistor. The driving thin film transistor includes a driving control electrode, a driving semiconductor overlapping the driving control electrode, and the driving semiconductor includes crystallized silicon having a doped region and a non-doped region, a driving gate insulating layer deposited between the driving control electrode and the driving semiconductor, and a driving input electrode and a driving output electrode opposed to the driving input electrode, the driving input electrode and the driving output electrode deposited on the driving semiconductor, wherein the interface between the driving gate insulating layer and the driving semiconductor includes nitrogen.

The driving gate insulating layer may include silicon oxide, and the concentration of nitrogen included in the interface between the driving gate insulating layer and the driving semiconductor may be between about 0.06 atomic percent to about 4.75 atomic percent, based on the total composition of the driving gate insulating layer.

The driving input electrode and the driving output electrode of the driving thin film transistor may respectively overlap the doped regions with respect to the non-doped region, and the driving input electrode and the driving output electrode of the driving thin film transistor may be apart from the non-doped region between about micrometer 1 to about 3 micrometers and respectively overlap the doped regions.

The switching thin film transistor may include a switching control electrode, a switching semiconductor overlapping the switching control electrode and including amorphous silicon, a switching gate insulating layer disposed between the switching control electrode and the switching semiconductor and including silicon nitride, and a switching input electrode and a switching output electrode opposite to each other on the switching semiconductor.

The driving semiconductor may be disposed at the boundary of the driving control electrode, and the switching semiconductor is disposed at the boundary of the switching control electrode.

The driving control electrode and the switching control electrode may be formed with different thicknesses from each other, and the driving control electrode may have a thinner thickness than the switching control electrode.

The thickness of the driving control electrode may be between about 50 micrometer to about 120 microns.

The organic light emitting device may further include a buffer layer formed on the insulating substrate, the driving semiconductor is formed on the buffer layer, and the interface between the buffer layer and the driving semiconductor includes nitrogen gas.

The amount of nitrogen gas included in the interface between the driving gate insulating layer and the driving semiconductor may be between about 0.06 atomic percent to about 4.75 atomic percent, based on the total composition of the driving gate insulating layer.

Also disclosed is a method for manufacturing an organic light emitting device, the method including forming a switching control electrode and a driving control electrode on a substrate, forming a driving gate insulating layer on the driving control electrode, plasma-treating the surface of the driving gate insulating layer with a nitrogen-containing gas, depositing a first amorphous silicon layer on the driving gate insulating layer, crystallizing the first amorphous silicon layer to form a driving semiconductor, forming a driving input electrode and a driving output electrode on the driving semiconductor, depositing a switching gate insulating layer on an entire surface, the entire surface including the driving input electrode and the driving output electrode, forming a switching semiconductor on the switching gate insulating layer, forming a switching input electrode and a switching output electrode on the switching semiconductor, forming a pixel electrode electrically connected to the driving output electrode, forming an emission layer on the pixel electrode, and forming a common electrode on the emission layer.

The forming of the driving gate insulating layer may include depositing silicon oxide.

The nitrogen-containing gas may be ammonia gas.

The forming of the driving semiconductor may include doping at least a portion of the first amorphous silicon layer.

The doping of the first amorphous silicon layer may include forming a doping stopper overlapping the driving control electrode on the first amorphous silicon layer, doping the first amorphous silicon layer with an n-type or p-type impurity, and patterning the doped first amorphous silicon layer, wherein the width of the doping stopper may be narrower than the patterned first amorphous silicon layer.

The first amorphous silicon layer may be crystallized through a solidification crystallization process, and the solidification crystallization process is performed between about 650° C. to about 750° C.

The doping of the first amorphous silicon layer may include forming a doping stopper overlapping the driving control electrode on the first amorphous silicon layer and doping the first amorphous silicon layer with an n-type or p-type impurity, and the crystallized first amorphous silicon layer may be patterned after crystallizing the first amorphous silicon layer.

The substrate may be pre-compacted.

A method for manufacturing an organic light emitting device includes forming a driving control electrode on a substrate, forming a driving gate insulating layer on the driving control electrode, forming a first amorphous silicon layer on the driving gate insulating layer, crystallizing the first amorphous silicon layer to form a crystallized driving semiconductor, forming a driving input electrode and a driving output electrode on the driving semiconductor, the driving input electrode deposited opposite to the driving output electrode, and forming a switching control electrode separated from the driving semiconductor, forming a switching gate insulating layer on a surface, the surface comprising a surface of the driving input electrode, the driving output electrode, and the switching control electrode, forming a switching semiconductor overlapping the switching control electrode on the switching gate insulating layer, forming a switching input electrode and a switching output electrode on the switching semiconductor, forming a pixel electrode connected to the driving output electrode, forming an emission layer on the pixel electrode, and forming a common electrode on the emission layer.

The driving control electrode and the switching control electrode may be formed with different thicknesses.

The driving gate insulating layer and the switching gate insulating layer may be formed with different thicknesses.

The forming of the driving gate insulating layer includes depositing silicon oxide, and the forming of the switching gate insulating layer includes depositing silicon nitride.

The method may further include plasma-treating the surface of the driving gate insulating layer by using a nitrogen-containing gas between the forming of the driving gate insulating layer and the depositing of the first amorphous silicon layer.

The first amorphous silicon layer may be crystallized by using a solidification crystallization process.

Also disclosed is a method for manufacturing an organic light emitting device, the method including forming a buffer layer including silicon oxide on an insulating substrate, plasma-treating the surface of the buffer layer with a nitrogen-containing gas, forming a driving semiconductor including polysilicon on the buffer layer, forming a driving voltage line, the driving voltage line including a driving input electrode overlapping the driving semiconductor and a driving output electrode facing the driving input electrode, forming a driving gate insulating layer on the driving semiconductor, forming a gate line, the gate line including a switching control electrode, and a driving control electrode, the driving control electrode overlapping the driving semiconductor on the driving gate insulating layer, forming a switching gate insulating layer on the switching control electrode, forming a switching semiconductor on the switching gate insulating layer, forming a data line and a switching output electrode, the data line including a switching input electrode and the switching output electrode facing the switching input electrode on the switching semiconductor, forming a passivation layer on the switching semiconductor, forming a connecting member, the connecting member connecting the switching output electrode and the switching control electrode, and forming a pixel electrode, the pixel electrode connected to the driving output electrode on the passivation layer, forming an emission layer on the pixel electrode, and forming a common electrode on the emission layer.

The driving gate insulating layer may include silicon oxide, and the surface of the driving gate insulating layer is plasma-treated by using a nitrogen-containing gas.

The nitrogen-containing gas may be an ammonia gas.

The forming of the driving semiconductor may include doping conductive impurity ions.

The driving semiconductor may be crystallized by a solidification crystallization process.

The driving gate insulating layer or the buffer layer is plasma-treated such that the characteristics of the driving thin film transistor may be improved.

DETAILED DESCRIPTION OF THE INVENTION

Figure 1:
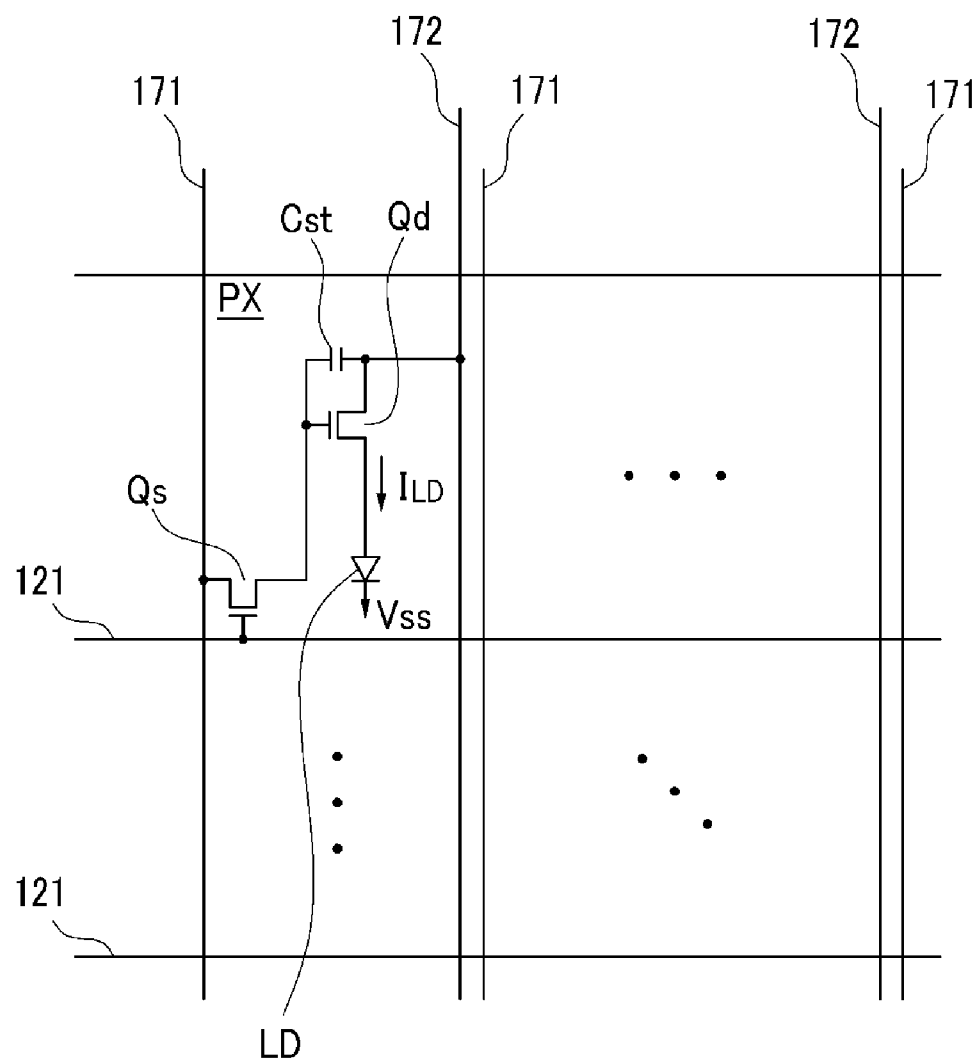
FIG. 1 is an equivalent circuit diagram showing an exemplary embodiment of an organic light emitting device.

The disclosed embodiments will be described more fully hereinafter with reference to the accompanying drawings, in which exemplary embodiments are shown. As one skilled in the art would realize, the disclosed embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary Embodiment 1

An organic light emitting device according to an exemplary embodiment will be described in detail with reference to FIG. 1.

FIG. 1 is an equivalent circuit diagram of an organic light emitting device according to an exemplary embodiment.

Referring to FIG. 1, an organic light emitting device includes a plurality of signal lines 121, 171, and 172, and a plurality of pixels "PX" electrically connected thereto and arranged substantially in a matrix.

The signal lines include a plurality of gate lines 121 for transmitting gate signals (or scanning signals), a plurality of data lines 171 for transmitting data signals, and a plurality of driving voltage lines 172 for transmitting a driving voltage. The gate lines 121 extend substantially in a row direction and are substantially parallel to each other, and the data lines 171 and the driving voltage lines 172 extend substantially in a column direction and are substantially parallel to each other.

Each pixel PX includes a switching thin film transistor "Qs", a driving thin film transistor "Qd", a storage capacitor "Cst", and an organic light emitting diode "LD".

The switching transistor Qs has a control terminal that is electrically connected to one of the gate lines 121, an input terminal that is electrically connected to one of the data lines 171, and an output terminal that is electrically connected to the driving transistor Qd. The switching transistor Qs transmits the data signals applied to the data line 171 to the driving transistor Qd in response to a gate signal applied to the gate line 121.

The driving transistor Qd has a control terminal that is electrically connected to the switching transistor Qs, an input terminal that is electrically connected to the driving voltage line 172, and an output terminal that is electrically connected to the organic light emitting diode LD. The driving transistor Qd drives an output current "ILD", which has a magnitude that depends on the voltage between the control terminal and the output terminal.

The storage capacitor Cst is electrically connected between the control terminal and the input terminal of the driving transistor Qd. The storage capacitor Cst stores a data signal applied to the control terminal of the driving transistor Qd and maintains the data signal after the switching transistor Qs turns off.

The organic light emitting diode LD has an anode that is electrically connected to the output terminal of the driving transistor Qd and a cathode that is electrically connected to a common voltage Vss. The organic light emitting diode LD emits light. The light has an intensity that depends on the output current ILD of the driving transistor Qd. Accordingly, an array of OLEDs can display an image.

The switching transistor Qs and the driving transistor Qd can be n-channel field effect transistors ("FETs"), and at least one of the switching transistors Qs and the driving transistors Qd may be a p-channel FET. In addition, the connections among the transistors Qs and Qd, the storage capacitor Cst, and the organic light emitting diode LD can have other configurations.

The organic light emitting device shown in FIG. 1 will now be described in detail with reference to FIG. 2 and FIG. 3 as well as FIG. 1.

Figure 2:
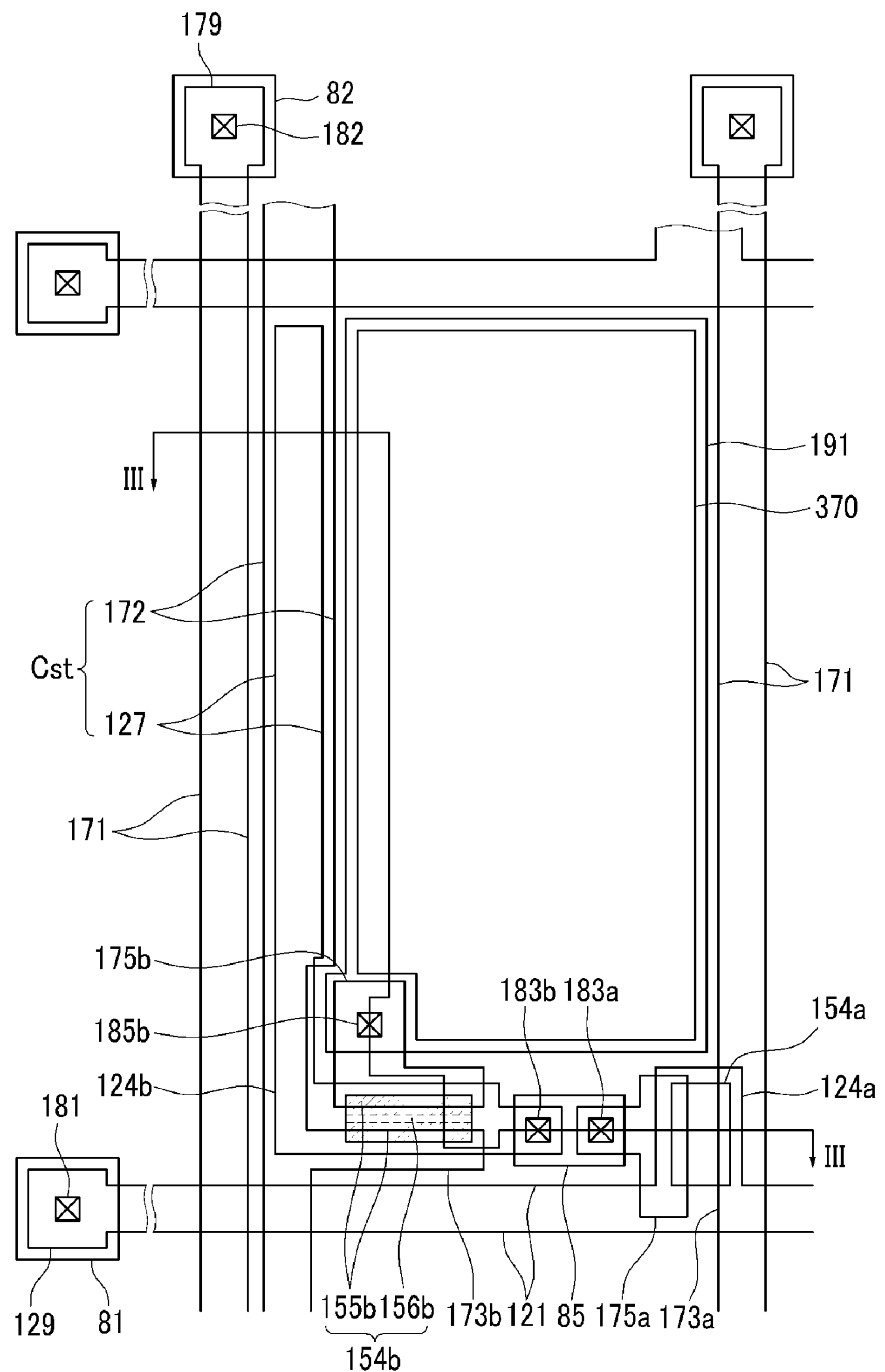
FIG. 2 is a plan view showing an exemplary embodiment of an organic light emitting device.
Figure 3:
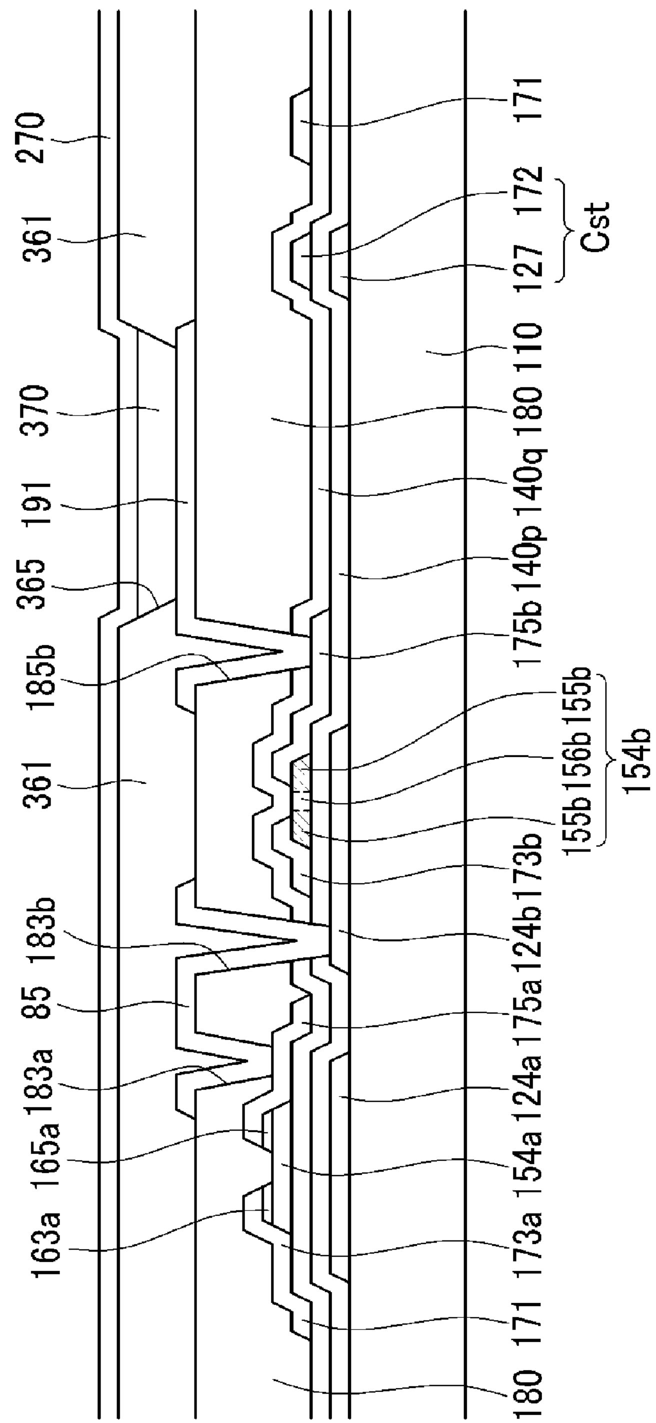
FIG. 3 is a cross-sectional view showing an exemplary embodiment of the organic light emitting device shown in FIG. 2 taken along the line III-III.

FIG. 2 is a plan view of an organic light emitting device according to an exemplary embodiment, and FIG. 3 is a cross-sectional view of the organic light emitting device shown in FIG. 2 taken along the line III-III.

An insulation substrate 110 made of transparent glass or plastic is disposed. The insulation substrate 110 may be modified with a pre-compaction treatment. In the pre-compaction treatment, the substrate is heat-treated at a temperature between about 300° C. to about 1000° C., specifically about 500° C. to about 800° C., more specifically about 600° C. to about 700° C., such that the substrate undergoes thermal expansion and contraction. This pre-compaction treatment prevents the substrate from thermally expanding or contracting during a solidification crystallization process, which will be described later. The pre-compaction treatment thereby prevents generation of an alignment error, which can occur if layers become misaligned.

A plurality of gate lines 121, including a plurality of switching electrodes **124*a* and a plurality of driving control electrodes 124*b*, are disposed on the substrate 110**.

The gate lines 121 extend in one direction of the substrate, and include the switching control electrodes **124*a* and an end portion 129 for electrical connection with an external driving circuit, as is shown in FIG. 2**.

The driving control electrodes **124*b* are separated from the gate lines 121, and include a storage electrode 127, as is shown in FIG. 2**.

The gate lines 121 and the driving control electrodes **124*b*** comprise a refractory metal, such as a molybdenum-containing metal. The refractory metal includes molybdenum (Mo), a molybdenum alloy, a chromium-containing metal, chromium (Cr), a chromium alloy, a titanium-containing metal, titanium (Ti), a titanium alloy, a tantalum-containing metal, tantalum (Ta), a tantalum alloy, a tungsten-containing metal, tungsten (W), a tungsten alloy, or the like, or a combination comprising at least one of the foregoing refractory metals. Also, the refractory metal can comprise a low resistance metal, such as aluminum (Al), copper (Cu), silver (Ag), or the like, or a combination comprising at least one of the foregoing low resistance metals.

A driving gate insulating layer 140*p* can be disposed on the gate lines 121 and the driving control electrodes 124*b*. The driving gate insulating layer 140*p* may be made of silicon oxide ("$SiO_2$") with a thickness between about 30 nanometers to about 500 nanometers, specifically about 50 nanometers to about 200 nanometers, more specifically about 75 nanometers to about 175 nanometers. If the driving gate insulating layer 140*p* is made of silicon nitride ("$SiN_x$"), the substrate may be stressed by contraction from dehydrogenation of the silicon nitride during crystallization of a driving semiconductor 154*b*, and the dielectric ratio may be deteriorated by the dehydrogenation. Accordingly, the driving gate insulating layer 140*p* is made of silicon oxide rather than silicon nitride.

A plurality of driving semiconductors 154*b* overlapping the driving control electrodes 124*b* are disposed on the driving gate insulating layer 140*p*, and the boundary of the driving semiconductors 154*b* is disposed at the boundary of the driving control electrode 124*b*. The driving semiconductors 154*b* have an island shape, and may be made of a crystalline silicon, such as microcrystalline silicon or polycrystalline silicon.

The driving semiconductors 154*b* respectively include doped regions 155*b* and non-doped regions 156*b*. The doped regions 155*b* are disposed on both sides of the central non-doped region 156*b*, and are made of crystalline silicon doped with an n-type impurity, such as phosphorous (P), or a p-type impurity such as boron (B). The non-doped region 156*b* comprises an intrinsic semiconductor that is not doped with an impurity, and forms the channel of the driving thin film transistor.

The interface between the driving gate insulating layer 140*p* and the driving semiconductor 154*b* is treated by plasma using a nitrogen-containing gas. The nitrogen-containing gas can comprise ammonia gas ("$NH_3$"), for example. It has been observed that about 0.06 atomic percent to about 4.75 atomic percent of nitrogen, based on the total composition of the driving gate insulating layer, remains in the interface between the driving gate insulating layer 140*p* and the driving semiconductor 154*b*, when analyzed by XPS (X-ray photoelectron spectroscopy) after the surface treatment. In an embodiment, the interface between the driving gate insulating layer 140*p* and the driving semiconductor 154*b* comprises between 0.01 atomic percent to 10 atomic percent nitrogen, specifically between about 0.05 atomic percent to about 5 atomic percent, more specifically about 0.1 atomic percent to about 3 atomic percent nitrogen, based on the total composition of the driving gate insulating layer, when analyzed by XPS.

As described above, the driving gate insulating layer 140*p* is plasma-treated with a nitrogen-containing gas such that the crystallinity of the driving semiconductor 154*b* is improved, as is described in greater detail below.

A plurality of driving voltage lines 172, including a plurality of driving input electrodes 173*b* and a plurality of driving output electrodes 175*b*, are disposed on the driving semiconductors 154*b* and the driving gate insulating layer 140*p*.

The driving voltage lines 172 extend substantially in a longitudinal direction, thereby intersecting the gate lines 121, and transmit a driving voltage. The driving voltage lines 172 include driving input electrodes 173*b* on the driving semiconductors 154*b*, and a portion of the driving voltage lines 172 overlap the storage electrodes 127 of the driving control electrodes 124*b* to form a storage capacitor ("Cst").

The driving output electrodes 175*b* are separated from the driving voltage lines 172 and have an island shape.

The driving input electrodes 173*b* and the driving output electrodes 175*b* are disposed on the doped regions 155*b* of the driving semiconductors 154*b*, and are disposed opposite to each other with respect to the non-doped regions 156*b* of the driving semiconductors 154*b*. Here, the driving input electrodes 173*b* and the non-doped regions 156*b*, and the driving output electrodes 175*b* and the non-doped regions 156*b*, are separated from each other by a selected interval therebetween. For example, the driving input electrodes 173*b* and the non-doped regions 156*b*, or the driving output electrodes 175*b* and the non-doped regions 156*b*, are separated from each other by between about 0.5 micrometers to about 7 micrometers, specifically about 1 micrometer to about 3 micrometers, or more specifically about 1.5 micrometers to about 2.5 micrometers, and most specifically by about 2 micrometers. Regions between the driving input electrodes 173*b* and the non-doped regions 156*b*, or the driving output electrodes 175*b* and the non-doped regions 156*b*, are offset regions and function to decrease contact resistance.

The driving voltage lines 172 and the driving output electrodes 175*b* may comprise the above-described refractory metal, or can comprise a low resistance metal, such as aluminum (Al), copper (Cu), silver (Ag), or the like, or a combination comprising at least one of the foregoing low resistance metals. The driving voltage lines 172 and the driving output electrodes 175*b* may comprise a single layer, or comprise a multilayered structure, such as a molybdenum (Mo)/aluminum (Al)/molybdenum (Mo) structure, or the like. In the case of the multilayered structure, the thickness of the molybdenum (Mo), aluminum (Al), and molybdenum (Mo) layers may respectively be between about 10 nanometers to about 100 nanometers, about 100 nanometers to about 500 nanometers, and about 50 nanometers to about 200 nanometers, specifically about 30 nanometers, about 250 nanometers, and about 100 nanometers, respectively.

A switching gate insulating layer 140*q* is formed on the driving voltage lines 172 and the driving output electrodes 175*b*. The switching gate insulating layer 140*q* may comprise silicon nitride ($SiN_x$) and may have a thickness between about 200 nanometers to about 500 nanometers, specifically about 300 nanometers to about 450 nanometers, more specifically about 350 nanometers to about 400 nanometers.

A plurality of switching semiconductors 154*a* overlapping the switching control electrodes 124*a* are disposed on the switching gate insulating layer 140*q*. The switching semiconductors 154*a* may comprise amorphous silicon and may have a thickness between about 100 nanometers to about 500 nanometers, specifically about 150 nanometers to about 250 nanometers, more specifically about 175 nanometers to about 200 nanometers.

A plurality of pairs of ohmic contacts 163*a* and 165*a* can be disposed on the switching semiconductors 154*a*. The ohmic contacts 163*a* and 165*a* can comprise amorphous silicon doped with an n-type or p-type impurity, and may have a thickness between about 10 nanometers to about 100 nanometers, specifically about 25 nanometers to about 75 nanometers, more specifically about 50 nanometers.

A plurality of data lines 171, including a plurality of switching input electrodes 173*a* and a plurality of switching output electrodes 175*a*, can be disposed on the ohmic contacts 163*a* and 165*a* and the switching gate insulating layer 140*q*.

The data lines 171 can extend substantially in the longitudinal direction, thereby intersecting the gate lines 121, and transmit data signals. A portion of the data lines 171 can overlap the switching semiconductor 154*a*, and form the switching input electrodes 173*a*.

The switching output electrodes 175*a* can be disposed opposite to the switching input electrodes 173*a* on the switching semiconductors 154*a*.

The data lines 171 and the switching output electrodes 175*a* may comprise the above-described refractory metal, and the above described low resistance metal, thus can comprise a metal such as aluminum (Al), copper (Cu), or silver (Ag), and can comprise a single layer, or have a multilayered structure, such as a molybdenum (Mo)/aluminum (Al)/molybdenum (Mo) structure as described above. In the case of the multilayered structure, the thickness of the molybdenum (Mo)/aluminum (Al)/molybdenum (Mo) layers may respectively be between about 10 nanometers to about 50 nanometers, about 100 nanometers to about 500 nanometers, and between about 50 nanometers to about 200 nanometers, specifically about 30 nanometers, about 250 nanometers, and about 100 nanometers, respectively.

A passivation layer 180 can be disposed on the data lines 171 and the switching output electrodes 175*a*. The passivation layer 180 may comprise an inorganic material such as silicon oxide, silicon nitride, or the like, or a combination comprising at least one of the foregoing inorganic materials, or the passivation layer 180 can comprise an organic material such as a polyacryl. The polyacryl can have an excellent flatness, and the thickness can be between about 0.100 micrometers to about 5 micrometers, specifically about 0.2 micrometers to about 2 micrometers, more specifically about 0.5 micrometers to about 1 micrometer.

The passivation layer 180 has a plurality of contact holes 183*a* and 182, exposing the switching output electrodes 175*a* and end portions 179 of the data lines 171. The passivation layer 180, and the switching gate insulating layer 140*q*, also have a plurality of contact holes 185*b* exposing the driving output electrodes 175*b*. In addition, the passivation layer 180, the switching gate insulating layer 140*q*, and the driving gate insulating layer 140*p* have a plurality of contact holes 183*b* and 181 exposing the driving control electrodes 124*b* and the end portions 129 of the gate lines 121.

A plurality of pixel electrodes 191, a plurality of connecting members 85, and a plurality of contact assistants 81 and 82 are disposed on the passivation layer 180.

The pixel electrodes 191 are electrically connected to the driving output electrodes 175*b* through the contact holes 185*b*, and may comprise a transparent conductor such as indium tin oxide "ITO" or indium zinc oxide "IZO".

The connecting members 85 electrically connect the switching output electrodes 175*a* and the driving control electrodes 124*b* through the contact holes 183*a* and 183*b*.

The contact assistants 81 and 82 are respectively connected to the end portions 129 and 179 of the gate lines 121 and the data lines 179 through the contact holes 181 and 182. The contact assistants 81 and 82 adhere the end portions 179 and 129 of the data lines 171 and gate lines 121 to outside components, and protect them.

An organic insulator 361 is disposed on the passivation layer 180 and the connecting member 85. The organic insulator 361 is a pixel-defining layer that surrounds the edges of the pixel electrodes 191. The organic insulator 361 can include a plurality of openings 365 exposing the pixel electrodes 191.

An organic light emitting member 370 can be disposed in the openings 365. The organic light emitting member 370 may have a multilayered structure that includes a light emission layer for emitting light and an auxiliary layer (not shown) for improving light emitting efficiency.

The emission layer is specifically made of a high molecular weight material, a low molecular weight material, or a mixture thereof, that emits light of one primary colors red, green, or blue.

The auxiliary layer may include an electron transport layer (not shown) and/or a hole transport layer (not shown) to provide a balance of electrons and holes, and an electron injection layer (not shown) and/or a hole injection layer (not shown) to reinforce the injection of the electrons and the holes.

The light emitting members 370, which emit light in of one of the primary colors, such as red, green, and blue, are respectively arranged in each pixel. Alternatively, the light emitting members 370 emitting light in the three colors, such as red, green, and blue, may all be arranged in one pixel, with vertical or horizontal deposition, to form a white emitting layer under or above the color filters which emit light in one of the primary colors, such as red, green and blue.

Alternatively, a four-color structure including red, green, blue, and white pixels may be arranged in a stripe or check configuration to improve the luminance, as an alternative to the three-color structure including red, green, and blue pixels.

A common electrode 270 can be disposed on the organic light emitting members 370. The common electrode 270 can be disposed on an entire surface of the substrate, and may be comprise an opaque conductor, such as Au, Pt, Ni, Cu, W, or the like, alloys thereof, or mixtures thereof.

The common electrode 270 supplies electric current to the light emitting members 370 in cooperation with the pixel electrodes 191.

In the above-described organic light emitting device, the switching control electrode 124*a* is electrically connected to the gate line 121, the switching input electrode 173*a* is electrically connected to the data line 171, and the switching output electrode 175*a* forms the switching thin film transistor Qs along with the switching semiconductor 154*a*, and the channel of the switching thin film transistor Qs is formed in the switching semiconductor 154*a* between the switching input electrode 173*a* and the switching output electrode 175*a*.

The driving control electrode 124*b* is electrically connected to the switching output electrode 175*a*, the driving input electrode 173*b* is electrically connected to the driving voltage line 172, and the driving output electrode 175*b* is electrically connected to the pixel electrode 191. The driving semiconductor 154*b* forms the driving thin film transistor Qd, and the channel of the driving thin film transistor Qd is disposed in the driving semiconductor 154*b* between the driving input electrode 173*b* and the driving output electrode 175*b*.

A pixel electrode 191, a light emitting member 370, and the common electrode 270 form an organic light emitting diode LD having the pixel electrode 191 as an anode and the common electrode 270 as a cathode, or vice versa.

In the above-described exemplary embodiment, the semiconductor of the driving thin film transistor can comprise a crystalline silicon such that high carrier mobility, stability, and uniformity for flowing sufficient electrical current to the organic light emitting device may be obtained, thereby improving the brightness of the organic light emitting device. In addition, because the channel of the driving thin film transistor is disposed in the crystalline semiconductor, the so-called threshold voltage shift phenomenon, caused by applying a constant positive voltage in driving of an OLED, may be eliminated such that an image-sticking phenomenon is not generated and a life-time reduction of the OLED does not occur.

Meanwhile, the on/off characteristics of the switching TFT are desirable because the switching TFT controls the data voltage. In particular, it is desirable to reduce the off-current. However, since a polycrystalline semiconductor has a large off-current, the data voltage passing the switching TFT may be reduced and crosstalk may be generated. Therefore, the data voltage is prevented from being reduced and the crosstalk is reduced by forming the switching TFT with an amorphous semiconductor having a small off-current.

Now, a method of manufacturing the display panel shown in FIGS. 2 and 3 is described with reference to FIGS. 4 to 21 as well as FIGS. 2 and 3.

Figure 4:
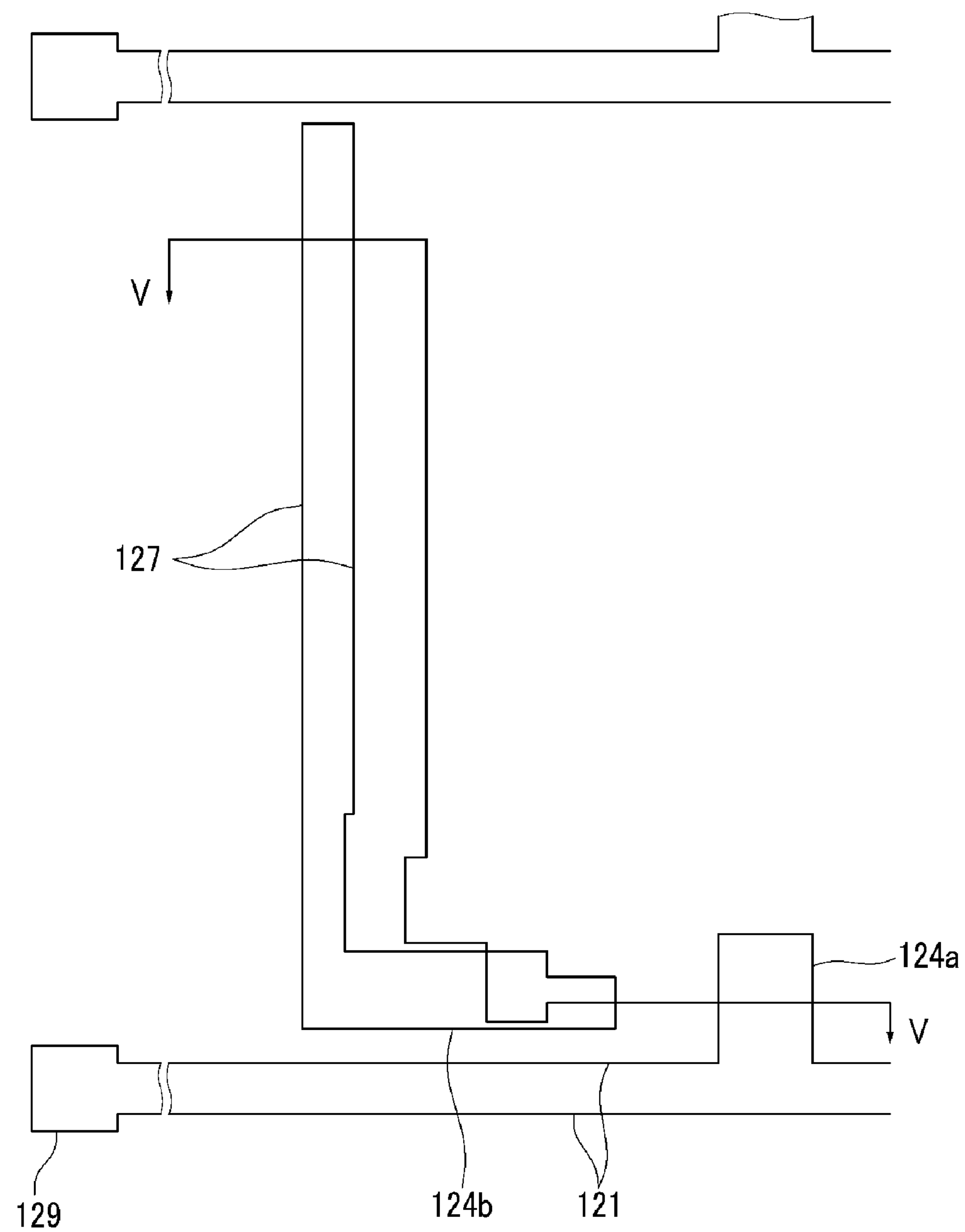
FIG. 4, FIG. 8, FIG. 10, FIG. 12, FIG. 14, FIG. 16, FIG. 18, and FIG. 20 are cross-sectional views sequentially showing an exemplary embodiment of a method of manufacturing the organic light emitting device shown in FIG. 2 and FIG. 3.
Figure 5:
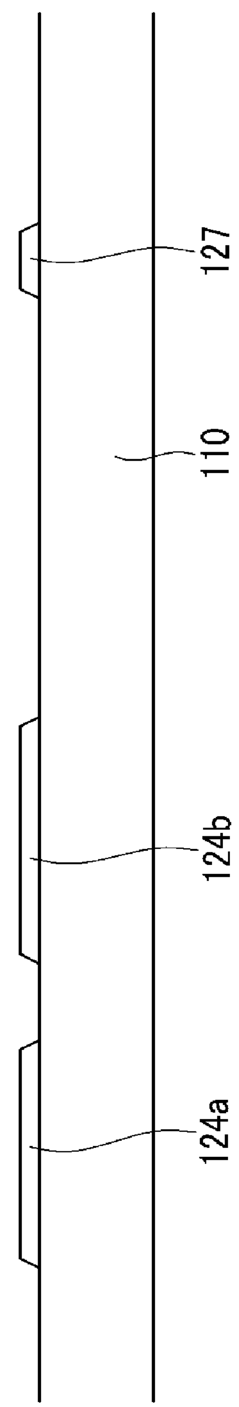
FIG. 5 is a cross-sectional view showing an exemplary embodiment of the organic light emitting device shown in FIG. 4 taken along the line V-V.
Figure 6:
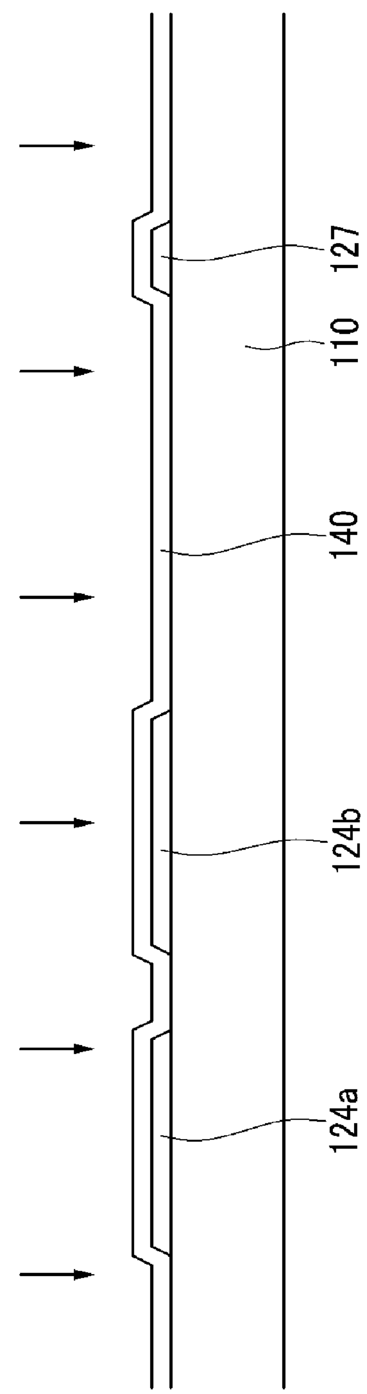
FIG. 6 and FIG. 7 are cross-sectional views sequentially showing an exemplary embodiment of a process for manufacturing the organic light emitting device shown in FIG. 4 and FIG. 5.
Figure 7:
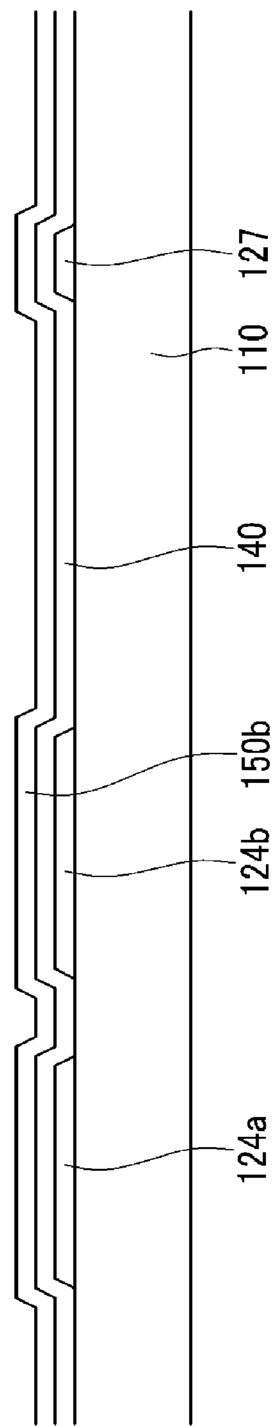
Figure 8:
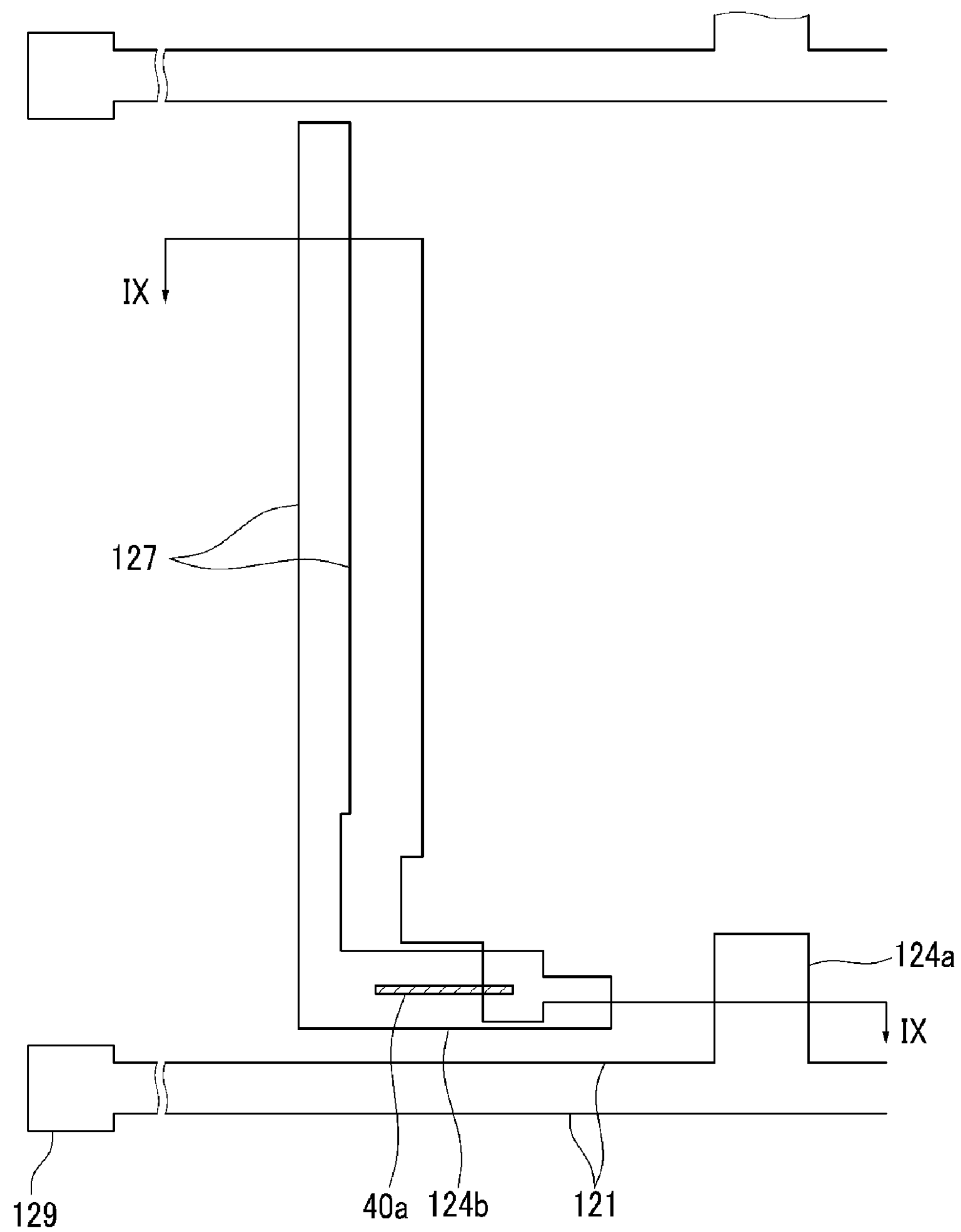
Figure 9:
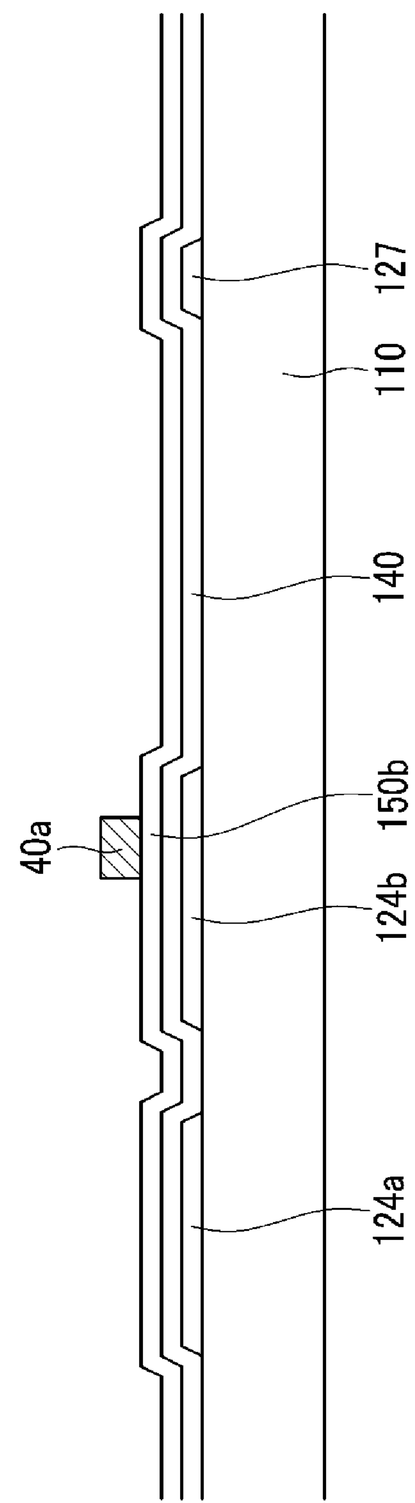
FIG. 9 is a cross-sectional view showing an exemplary embodiment of the organic light emitting device shown in FIG. 8 taken along the line IX-IX.
Figure 10:
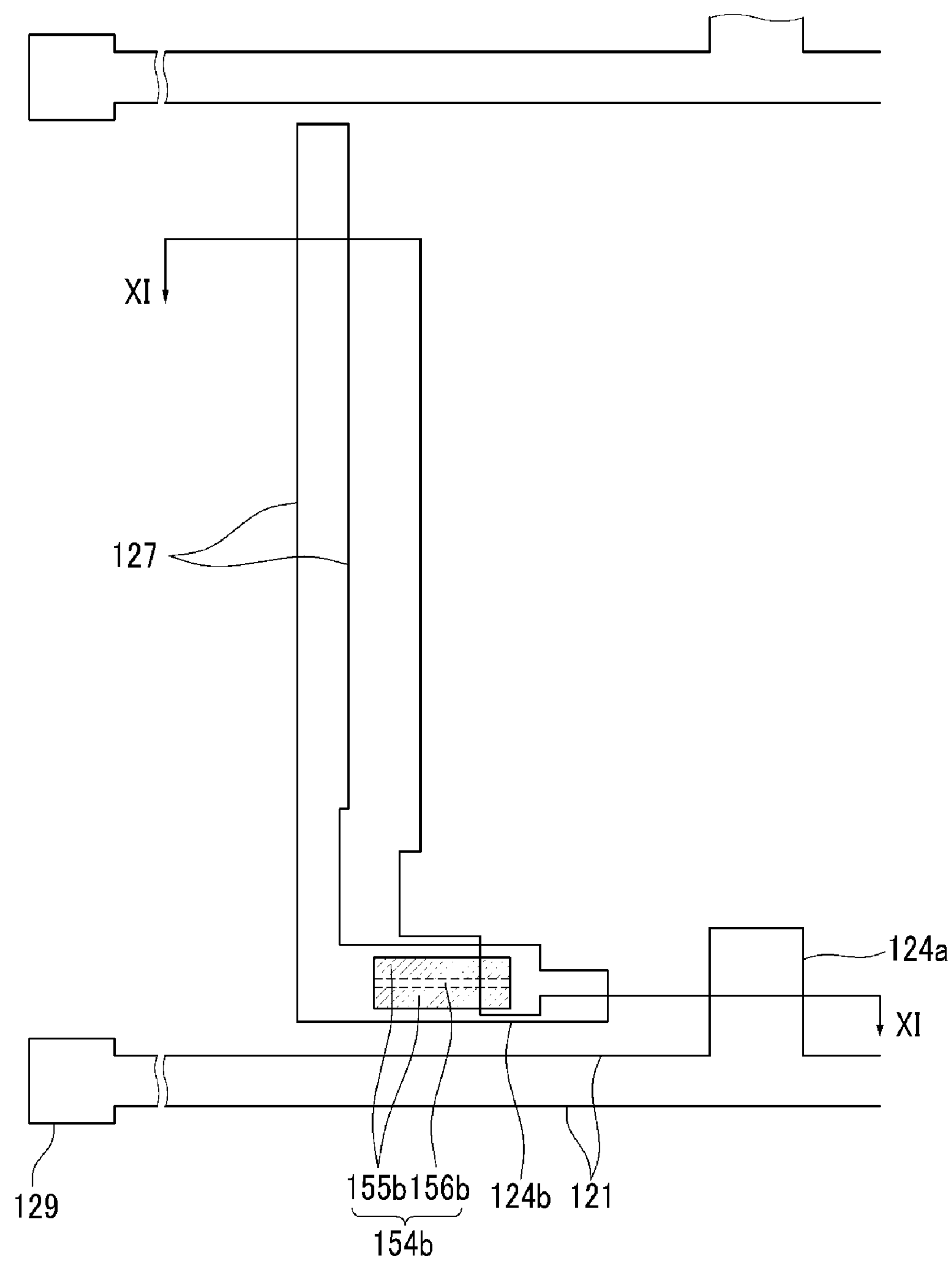
Figure 11:
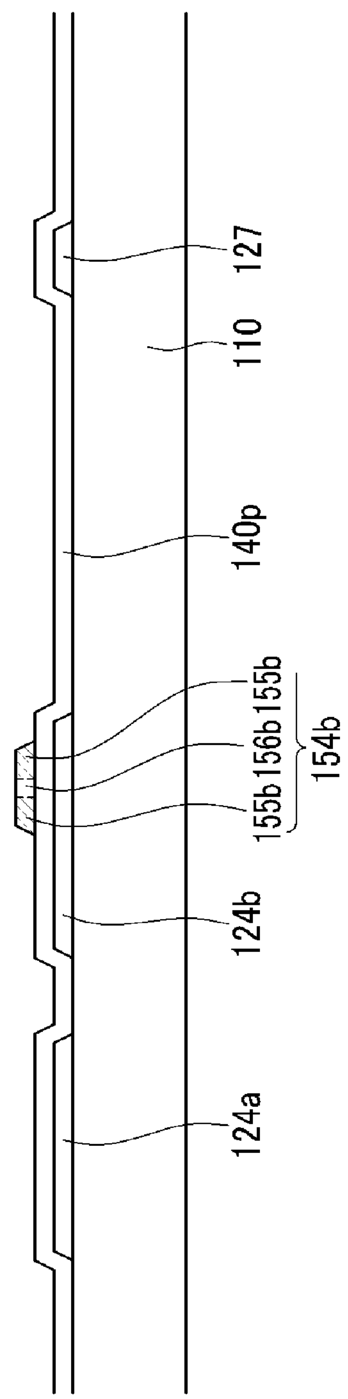
FIG. 11 is a cross-sectional view showing an exemplary embodiment of the organic light emitting device shown in FIG. 10 taken along the line XI-XI.
Figure 12:
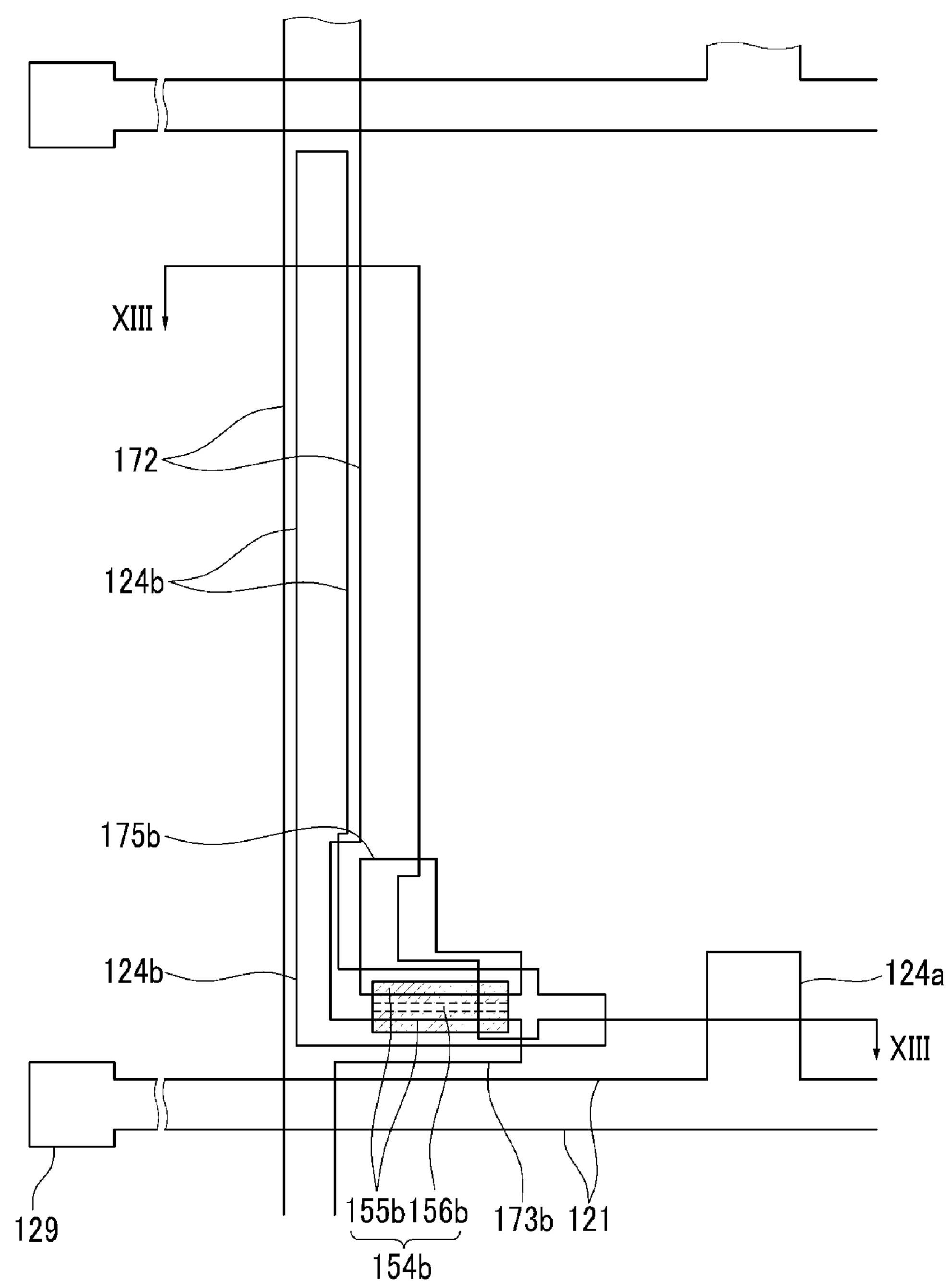
Figure 13:
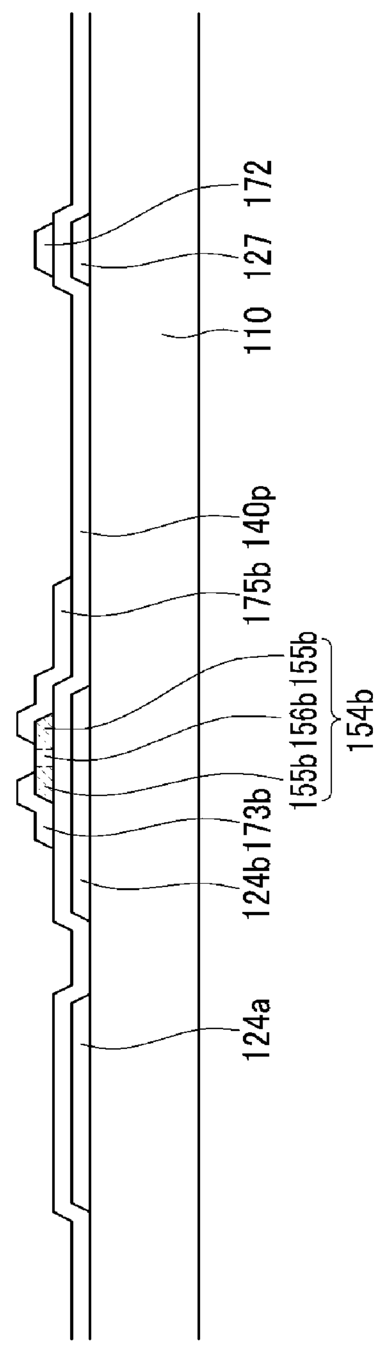
FIG. 13 is a cross-sectional view showing an exemplary embodiment of the organic light emitting device shown in FIG. 12 taken along the line XIII-XIII.
Figure 14:
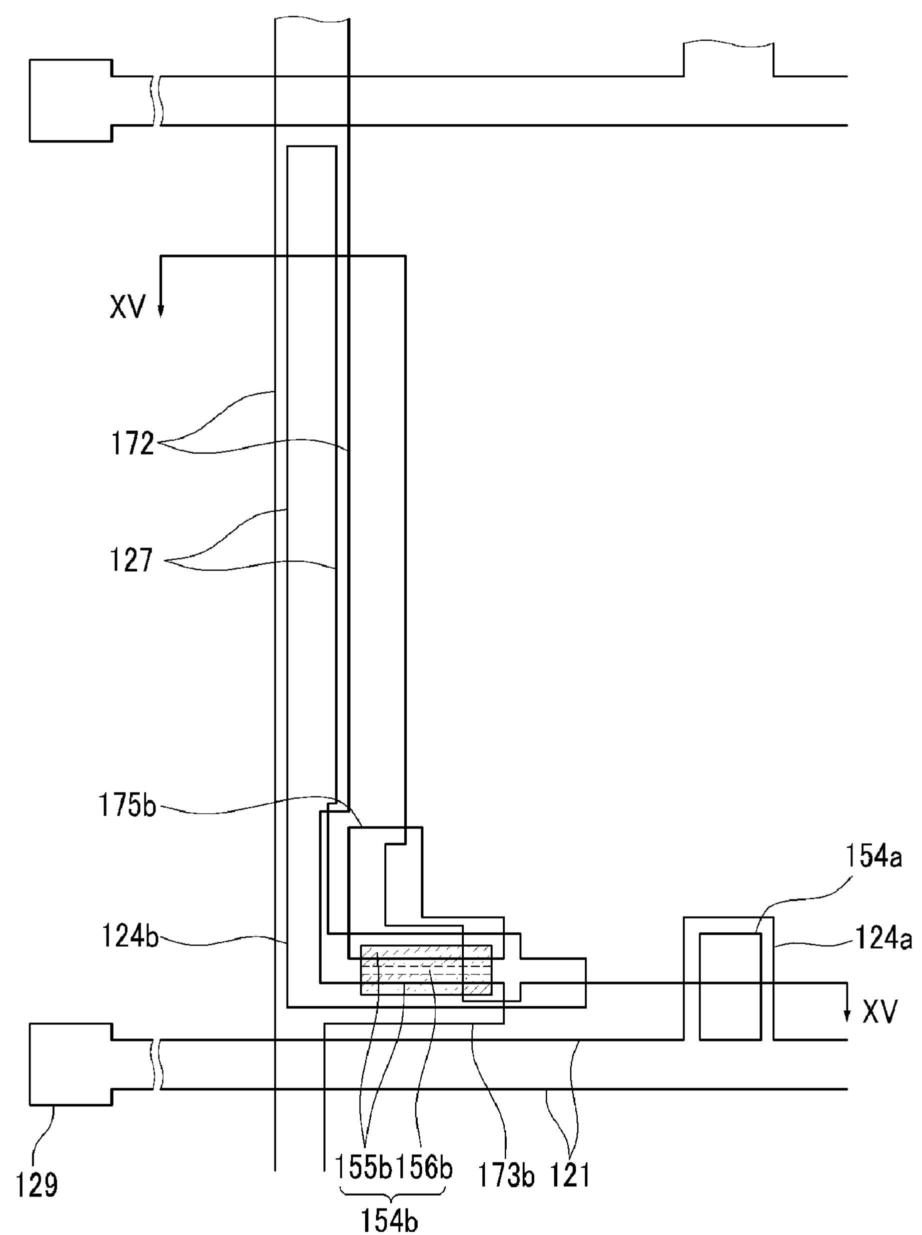
Figure 15:
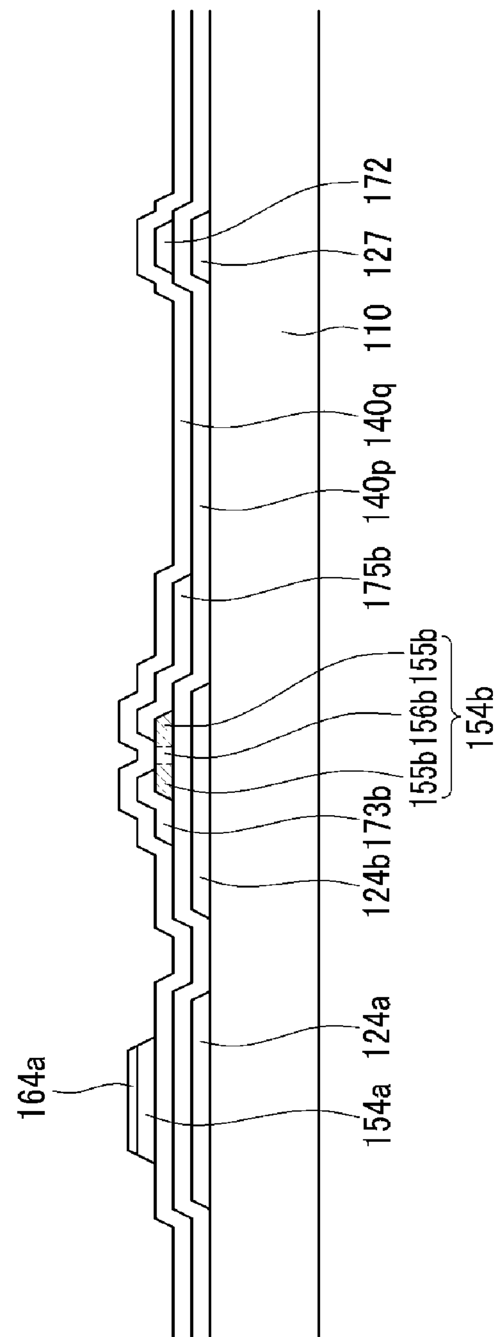
FIG. 15 is a cross-sectional view showing an exemplary embodiment of the organic light emitting device shown in FIG. 14 taken along the line XV-XV.
Figure 16:
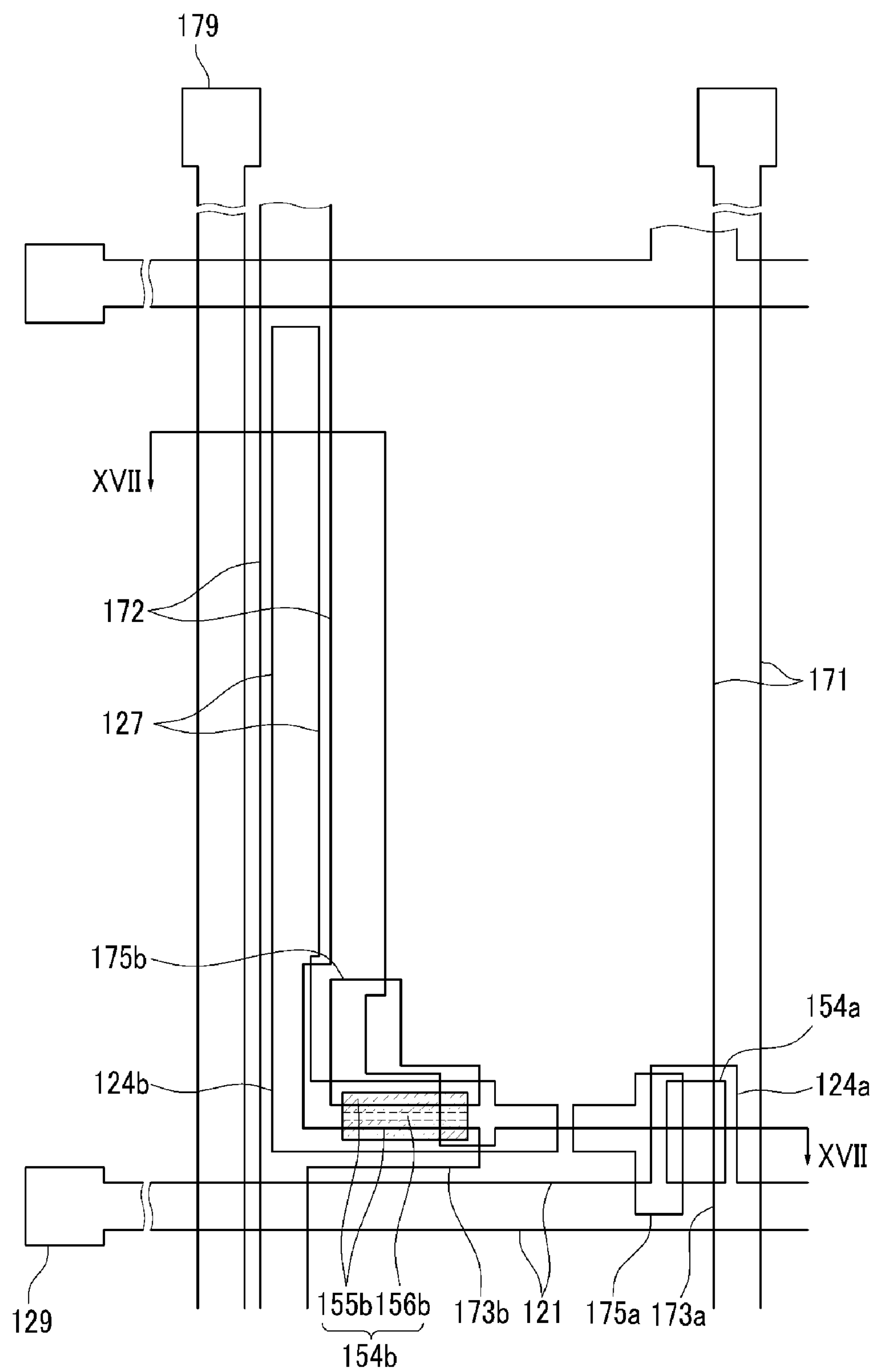
Figure 17:
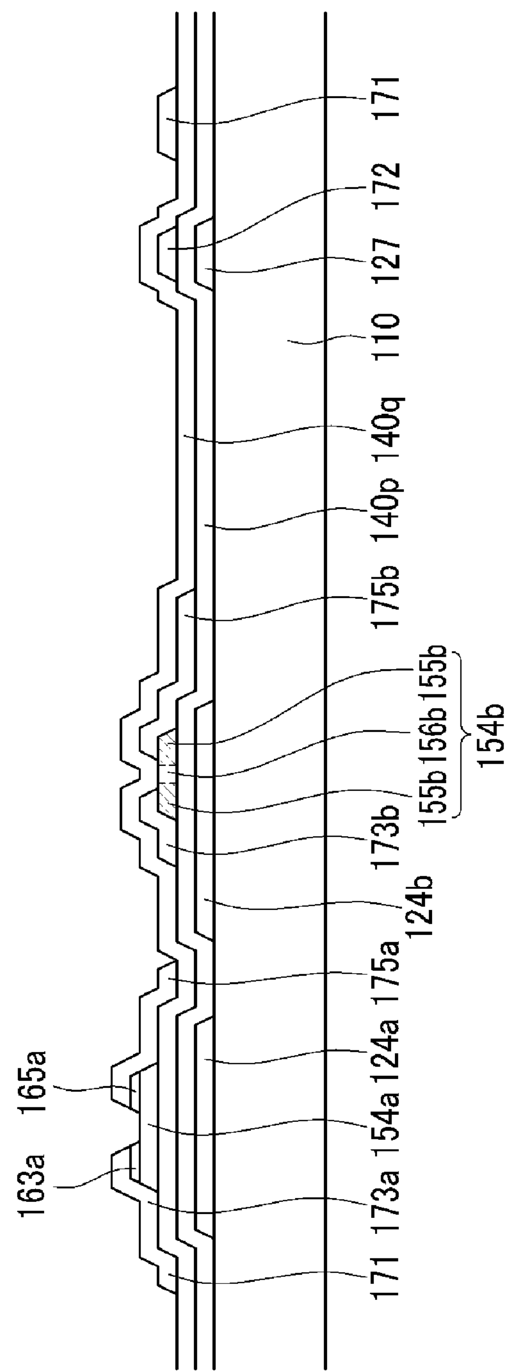
FIG. 17 is a cross-sectional view showing an exemplary embodiment of the organic light emitting device shown in FIG. 16 taken along the line XVII-XVII.
Figure 18:
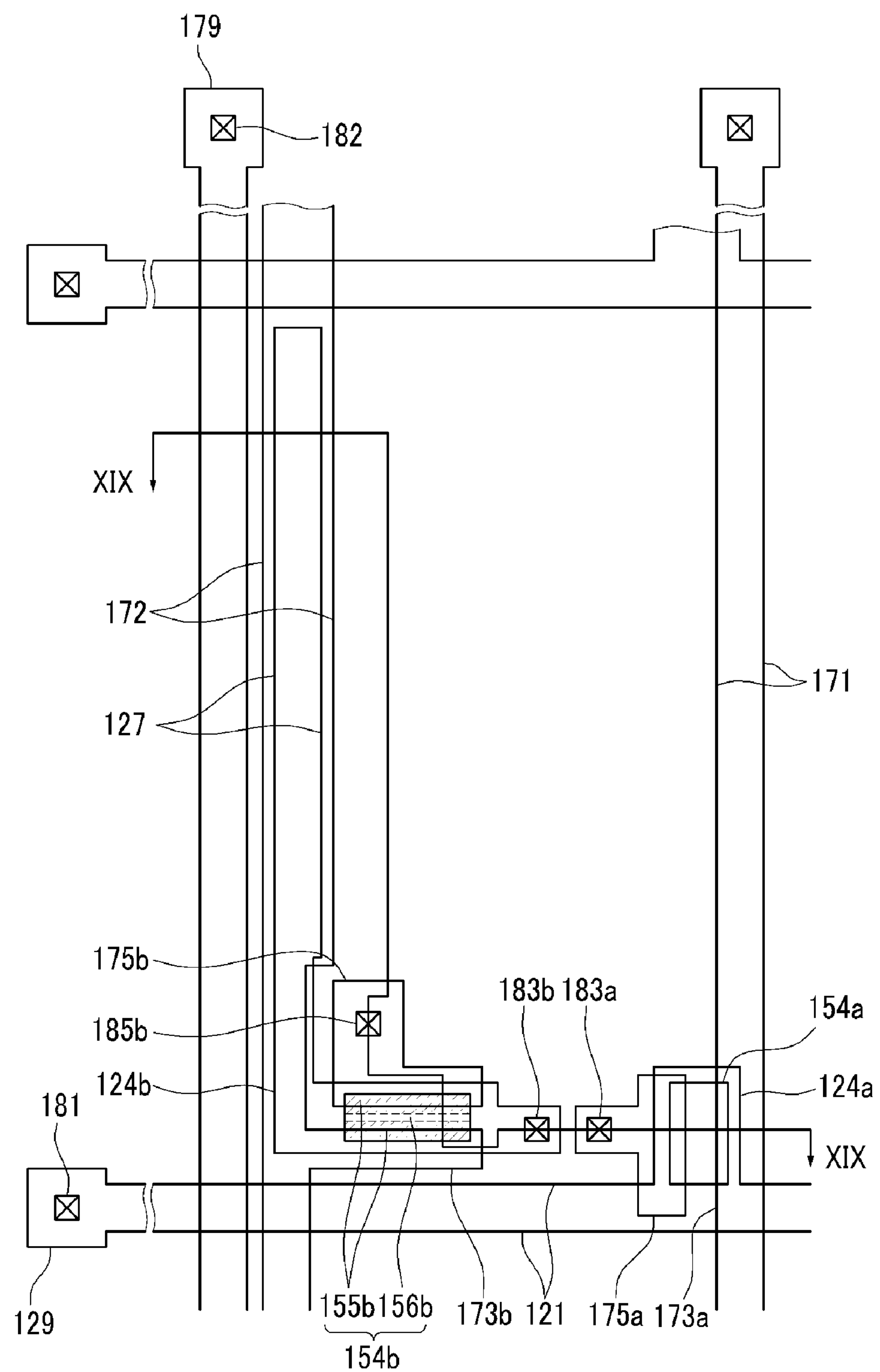
Figure 19:
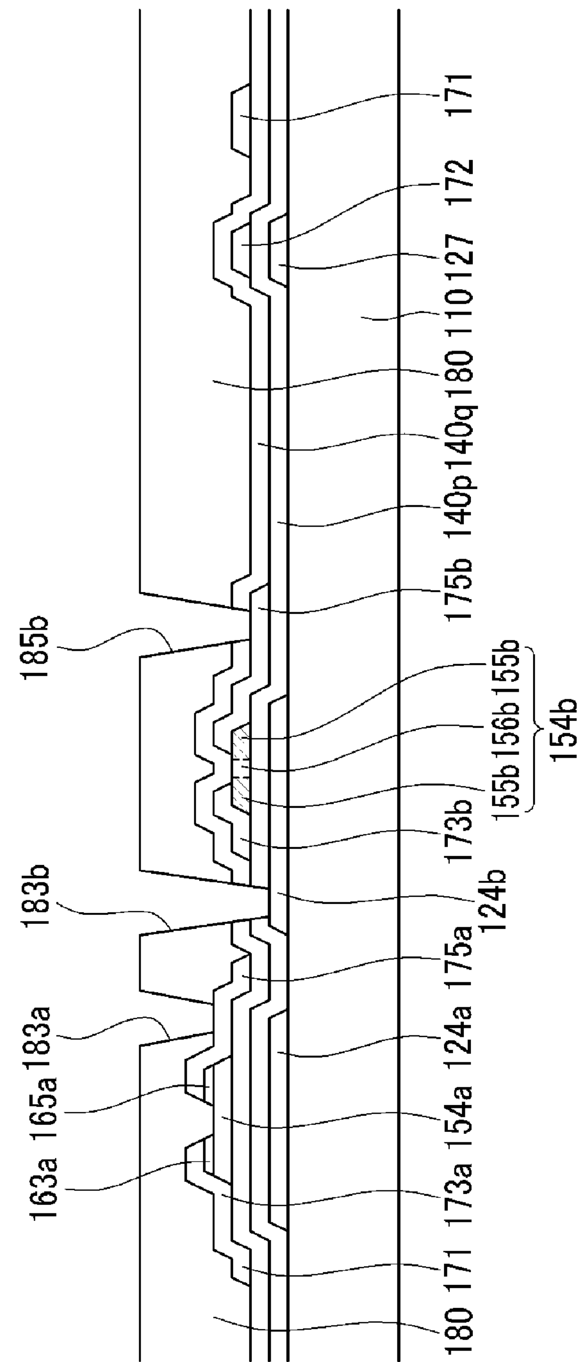
FIG. 19 is a cross-sectional view showing an exemplary embodiment of the organic light emitting device shown in FIG. 18 taken along the line XIX-XIX.
Figure 20:
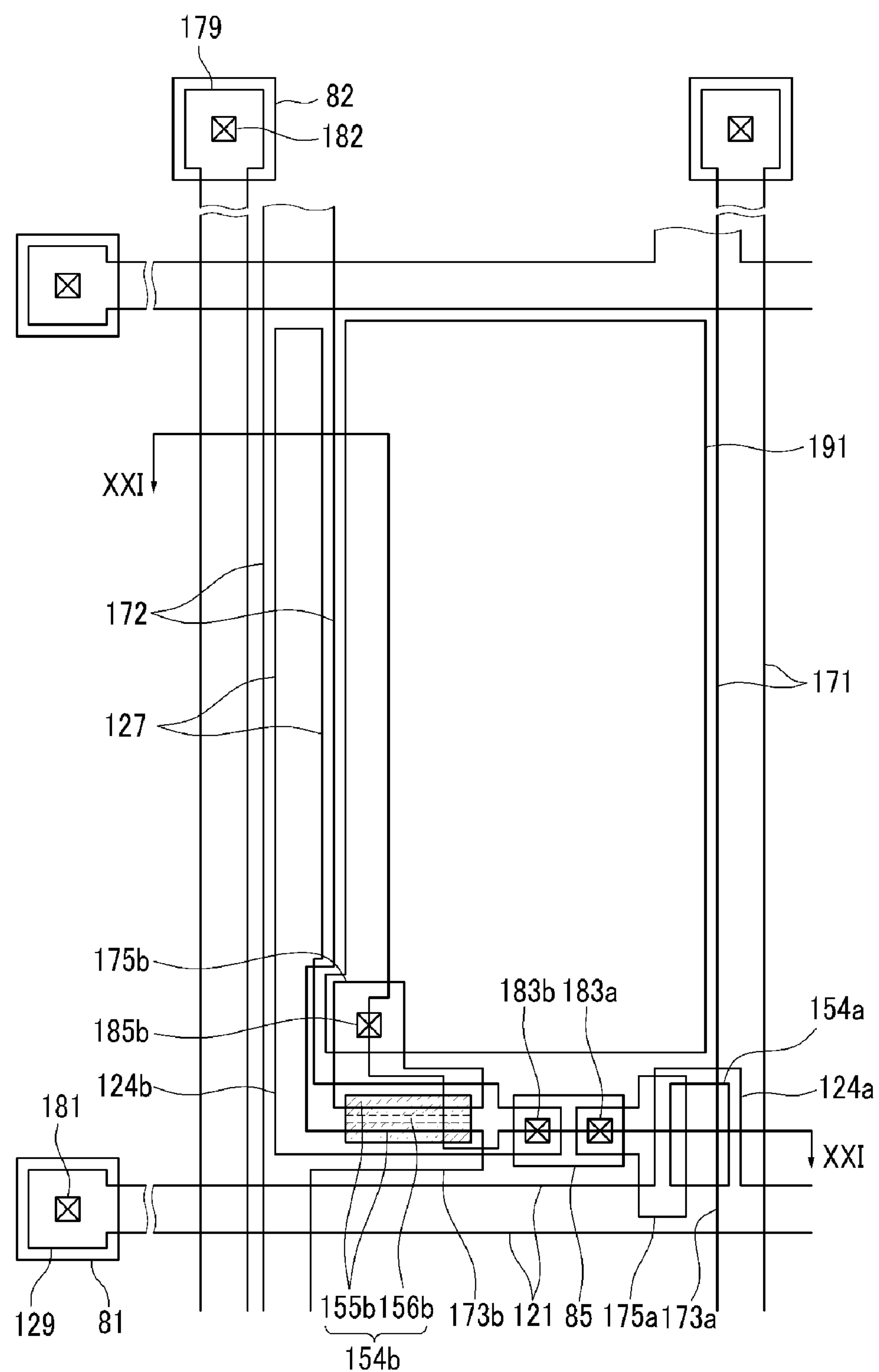
Figure 21:
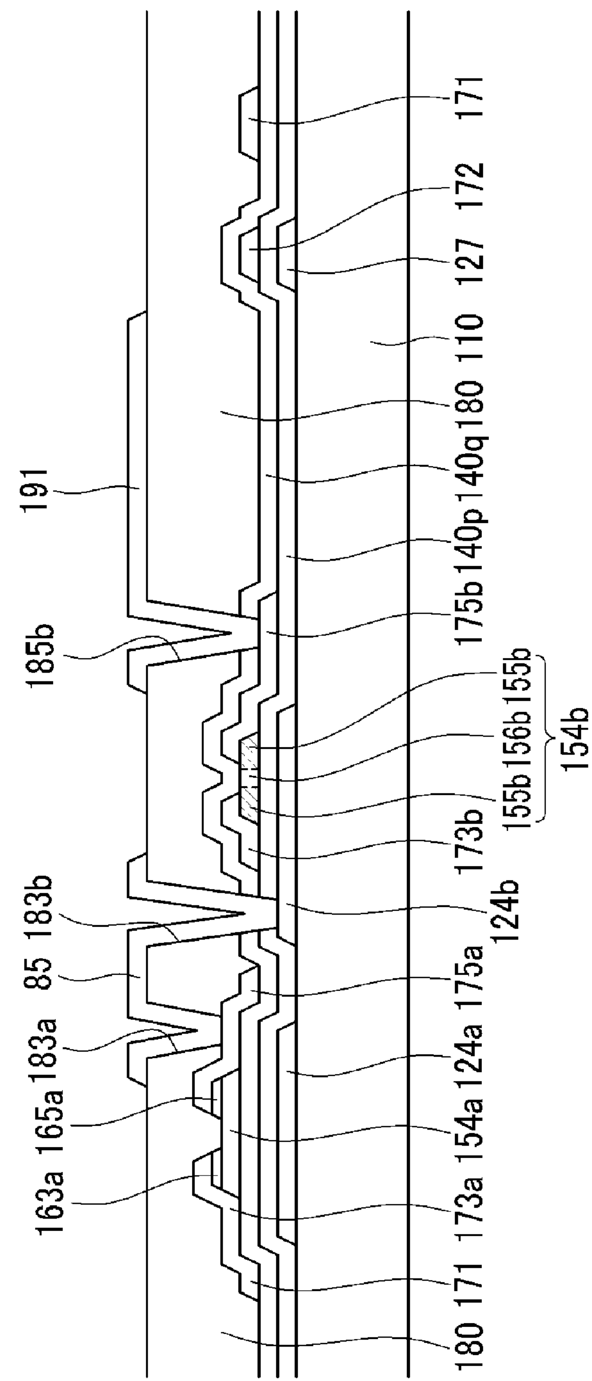
FIG. 21 is a cross-sectional view showing an exemplary embodiment of the organic light emitting device shown in FIG. 20 taken along the line XXI-XXI.

FIG. 4, FIG. 8, FIG. 10, FIG. 12, FIG. 14, FIG. 16, FIG. 18, and FIG. 20 are cross-sectional views sequentially showing an exemplary embodiment of a method of manufacturing the organic light emitting device shown in FIG. 2 and FIG. 3, FIG. 5 is a cross-sectional view of the organic light emitting device shown in FIG. 4, taken along the line V-V, FIG. 6 and FIG. 7 are cross-sectional views sequentially showing the manufacturing process of the organic light emitting device shown in FIG. 4 and FIG. 5, FIG. 9 is a cross-sectional view of the organic light emitting device shown in FIG. 8 taken along the line IX-IX, FIG. 11 is a cross-sectional view of the organic light emitting device shown in FIG. 10 taken along the line XI-XI, FIG. 13 is a cross-sectional view of the organic light emitting device shown in FIG. 12 taken along the line XIII-XIII, FIG. 15 is a cross-sectional view of the organic light emitting device shown in FIG. 14 taken along the line XV-XV, FIG. 17 is a cross-sectional view of the organic light emitting device shown in FIG. 16 taken along the line XVII-XVII, FIG. 19 is a cross-sectional view of the organic light emitting device shown in FIG. 18 taken along the line XIX-XIX, and FIG. 21 is a cross-sectional view of the organic light emitting device shown in FIG. 20 taken along the line XXI-XXI.

First, a pre-compaction process is performed on an insulation substrate 110. The pre-compaction process thermally expands and contracts the substrates 110 and 210 with heat by performing a heat treatment in advance at a high temperature between about 300° C. to about 1000° C., specifically about 500° C. to about 800° C., more specifically about 600° C. to about 700° C. The pre-compaction process can reduce subsequent thermal expansion or contraction of the substrate by heat during a solidification crystallization process that will be described later, thereby preventing misalignment.

Referring to FIG. 4 and FIG. 5, a metal layer (not shown) is disposed on the insulation substrate 110, which has undergone the pre-compaction treatment, and is patterned by photolithography to form a gate line 121 including a switching control electrode 124*a* and an end portion 129, and a driving control electrode 124*b* including a storage electrode 127.

Referring to FIG. 6 and FIG. 7, the driving gate insulating layer 140*p* of silicon oxide and the first amorphous silicon layer 150*b* are disposed on the whole surface of the substrate 110 including the gate line 121 and the driving control electrodes 124*b*.

Here, the silicon oxide is disposed by chemical vapor deposition on the whole surface of the substrate 110 including the gate line 121 and the driving control electrodes 124*b*, and the surface thereof is plasma-treated using a nitrogen-containing gas. The nitrogen-containing gas may comprise ammonia gas, or the like, for example. A first amorphous silicon layer 150*b* is disposed after the plasma treatment.

In has been surprisingly observed that when the plasma treatment with a nitrogen-containing gas is performed after disposing the silicon oxide layer, a thin nitride layer is disposed at the interface between the driving gate insulating layer and the first amorphous silicon layer such that the crystallization of the amorphous silicon is not disturbed by the silicon oxide layer in the crystallization process. This effect will be described with respect to the crystallization process.

Referring to FIG. 8 and FIG. 9, a doping stopper 40*a* is disposed at a position overlapping the driving control electrode 124*b* on the first amorphous silicon layer 150*b*. The doping stopper 40*a* can prevent the channel of the driving semiconductor 154*b* from being doped with the impurity in the impurity doping step. For example, the doping stopper 40*a* may comprise a positive photosensitive material, and the width thereof may be between about 1 micrometer to about 20 micrometers, specifically about 2 micrometers to about 10 micrometers, more specifically about 4 micrometers to about 8 micrometers, and the length thereof may be between about 10 micrometers to about 100 micrometers, specifically about 40 micrometers to about 60 micrometers, more specifically about 45 micrometers to about 55 micrometers.

Next, the first amorphous silicon layer 150*b* is doped with an impurity using the doping stopper 40*a* as a mask. The impurity may comprise a p-type impurity such as boron, or an n-type impurity, such as phosphorous, and for example the n-type impurity may be doped under the conditions of 10 KeV and $5\times10^{14}$ dose/cm$^2$ for $PH_3$ gas.

The doping stopper 40*a* is then removed.

Next, referring to FIG. 10 and FIG. 11, the first amorphous silicon layer is patterned by photolithography to dispose a driving semiconductor 154*b* with an island shape. The driving semiconductor 154*b* includes doped regions 155*b* and a non-doped region 156*b*.

Next, the driving semiconductor 154*b* is crystallized. For the crystallization, a method such as solid phase crystallization ("SPC"), rapid thermal annealing ("RTA"), liquid phase recrystallization ("LPR"), or excimer laser annealing ("ELA"), or the like, or a combination comprising at least one of the foregoing methods may be used, and it is desirable that solid phase crystallization is used because of its ease for crystallization of a large area. Solid phase crystallization may be performed through heat treatment between about 300° C. to about 1000° C., specifically about 500° C. to about 750° C., more specifically about 600° C. to about 700° C., and field-enhanced rapid thermal annealing ("FERTA") can be performed at a temperature between about 650° C. to about 750° C., specifically about 690° C. to about 705° C., more specifically at about 700° C.

In the crystallization, the activation of the driving semiconductor 154*b* may be simultaneously performed after doping the impurity. For the case of plasma treatment using the nitrogen gas, the characteristics of the thin film transistor will be described with reference to FIG. 24.

Figure 24:
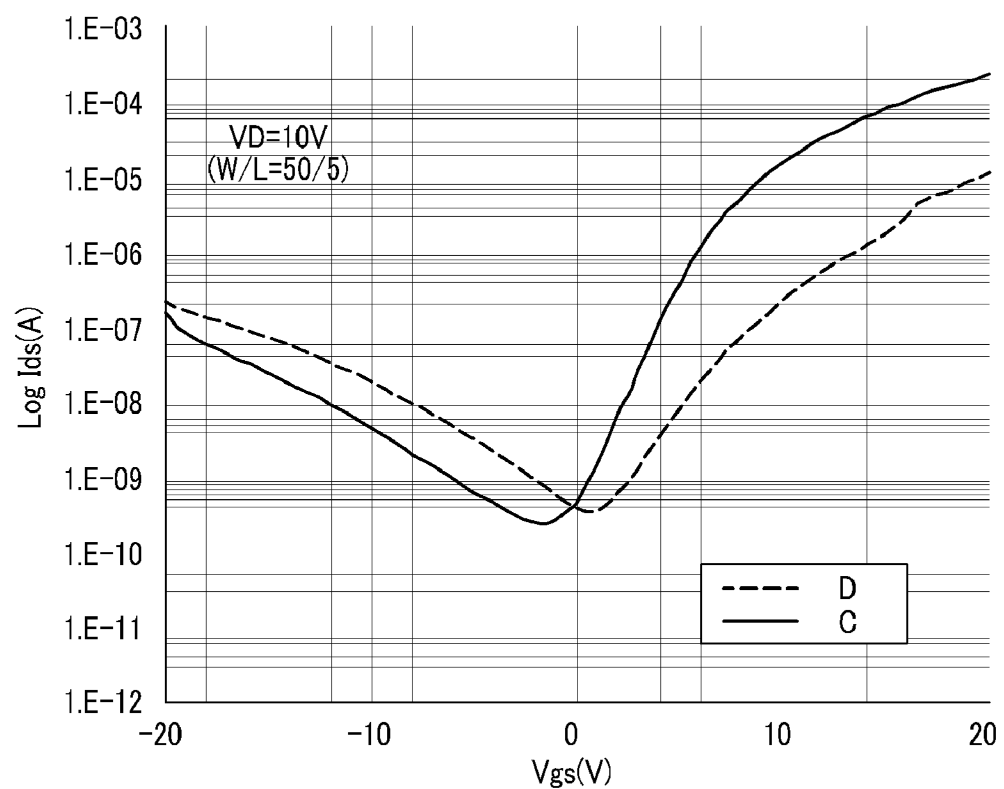
FIG. 24 is a graph showing characteristics of a driving thin film transistor of Example C in which a driving gate insulating layer is treated by plasma using ammonia and Comparative Example D in which a driving gate insulating layer is not treated.

FIG. 24 is a graph showing the characteristics of the driving thin film transistors in Example C, in which a driving gate insulating layer is treated by the plasma using ammonia, and a Comparative Example D, in which a driving gate insulating layer is not treated.

As is shown in FIG. 24, the on-current is improved in Example C, in which the driving gate insulating layer 140*p* is plasma-treated. This means that the crystallinity of the driving semiconductor 154*b* is improved by the plasma treatment with ammonia.

Next, referring to FIG. 12 and FIG. 13, a metal layer is disposed on the driving semiconductor 154*b* and the driving gate insulating layer 140*p*, and is patterned by photolithography to form a driving voltage line 172, including a driving input electrode 173*b* and a driving output electrode 175*b*. Here, the driving input electrode 173*b* and the driving output electrode 175*b* are apart from the non-doped region 156*b* of the driving semiconductor 154*b* by a predetermined interval.

Next, referring to FIG. 14 and FIG. 15, a switching gate insulating layer 140*q*, the second amorphous silicon layer (not shown), and a silicon layer (not shown) doped with an impurity are disposed on the entire surface of the substrate, including the driving voltage line 172 and the driving output electrode 175*b*.

The silicon layer doped with an impurity, and the second amorphous silicon layer, are then patterned by photolithography to dispose a switching semiconductor 154*a* and an ohmic contact layer 164*a* with an island shape.

Referring to FIG. 16 and FIG. 17, a metal layer is then disposed on the ohmic contact layer 164*a* and the switching gate insulating layer 140*q* and patterned by photolithography to dispose a data line 171 including a switching input electrode 173*a* and a switching output electrode 175*a*.

Next, the ohmic contact layer 164*a* is etched using the switching input electrode 173*a* and the switching output electrode 175*a* as a mask to dispose a pair of ohmic contacts 163*a* and 165*a*.

Referring to FIG. 18 and FIG. 19, a passivation layer 180 is then disposed on the entire surface of the substrate and patterned by photolithography to dispose a plurality of contact holes 181, 182, 183*a*, 183*b*, and 185*b*.

Then, referring to FIG. 20 and FIG. 21, a transparent conductive layer, such as ITO, is disposed on the passivation layer 180 and patterned by photolithography to dispose a pixel electrode 191, a connecting member 85, and contact assistants 81 and 82.

Next, referring to FIG. 2 and FIG. 3, an organic insulator 361 is disposed on the pixel electrode 191, the connecting member 85, and the passivation layer 180, and is exposed and developed to dispose a plurality of openings 365.

Subsequently, an organic light emitting member 370, including a hole transport layer (not shown) and an emission layer (not shown), is disposed in the openings 365. The organic light emitting member 370 may be made by a solution process such as an inkjet printing, or a deposition process using a shadow mask (not shown), or the like. For example, in Inkjet printing, an Inkjet head (not shown) is moved and a solution is dripped in the opening 365, and a dry process is required after disposing each layer.

Finally, a common electrode 270 is disposed on the organic insulator 361 and the organic light emitting member 370.

Exemplary Embodiment 2

An organic light emitting device according to another exemplary embodiment will now be described in detail with reference to FIG. 22 and FIG. 23.

Figure 22:
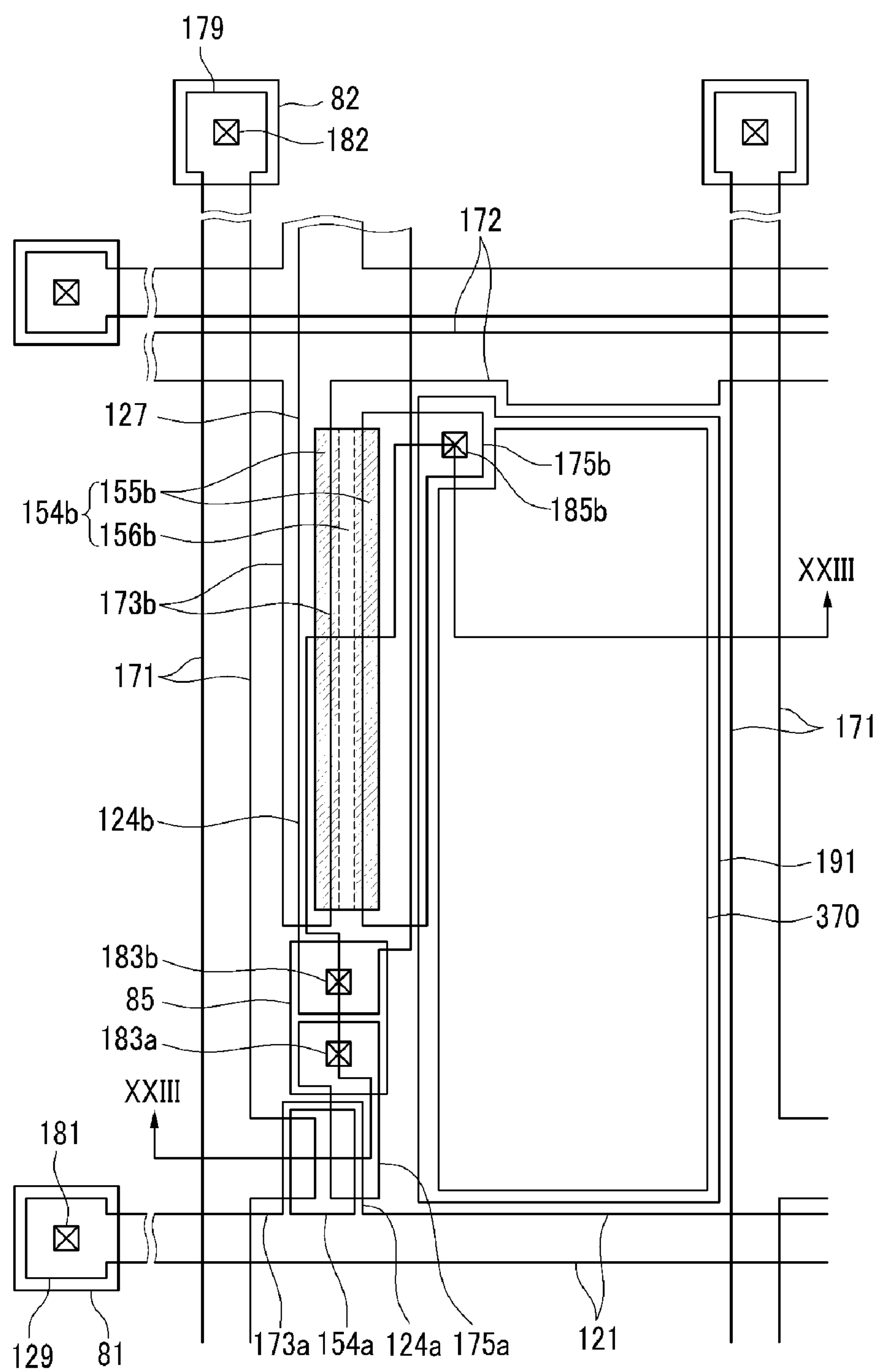
FIG. 22 is a plan view showing another exemplary embodiment of an organic light emitting device.
Figure 23:
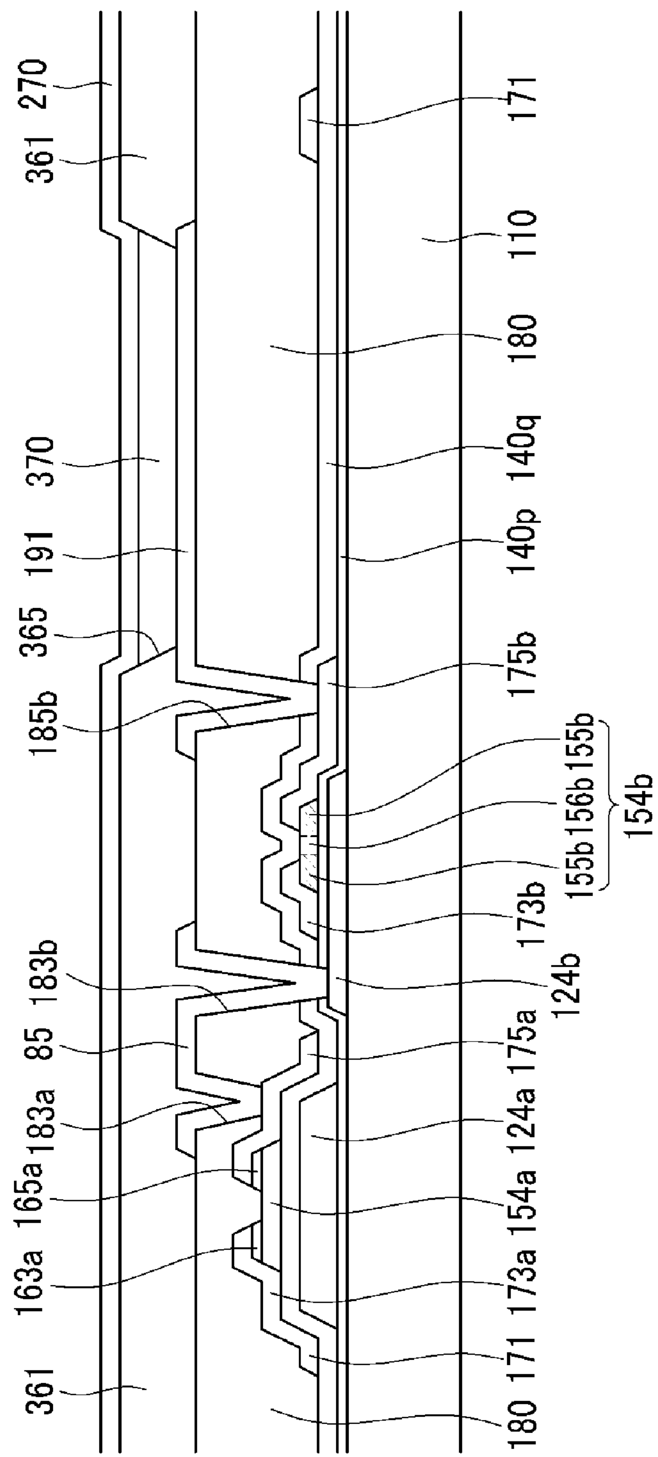
FIG. 23 is a cross-sectional view showing an exemplary embodiment of the organic light emitting device shown in FIG. 22 taken along the line XXIII-XXIII.

FIG. 22 is a plan view of an organic light emitting device according to another exemplary embodiment, and FIG. 23 is a cross-sectional view of the organic light emitting device shown in FIG. 22 taken along the line XXIII-XXIII.

In the present exemplary embodiment, descriptions of the same elements will be omitted, and the same constituent elements as in the above-described exemplary embodiment are indicated by the same reference numerals.

In the present exemplary embodiment, differently from the above-described exemplary embodiment, a gate line 121 including a switching control electrode 124*a*, and a driving control electrode 124*b*, are disposed with different layers, and the thicknesses thereof are different from each other. Also, the gate line 121, including a switching control electrode 124*a*, a driving voltage line 172, including a driving input electrode 173*b*, and a driving output electrode 175*b*, may be disposed with the same layer.

The deposition structure is described as follows.

A driving control electrode 124*b* is disposed an insulating substrate 110. The driving control electrode 124*b* can extends in a longitudinal direction, and a portion thereof is a storage electrode 127.

The driving control electrode 124*b* may comprise a refractory metal, such as a molybdenum-containing metal, molybdenum (Mo), a molybdenum alloy, a chromium-containing metal, chromium (Cr), a chromium alloy, a titanium-containing metal, titanium (Ti), a titanium alloy, a tantalum-containing metal, tantalum (Ta), a tantalum alloy, a tungsten-containing metal, tungsten (W), a tungsten alloy, or the like, or a combination comprising at least one of the foregoing refractory metals.

The refractory metal has melting point that is higher than the temperature of the semiconductor in the above-described solidification phase crystallization such that it may prevent the driving control electrode 124*b* from being melted or heat-damaged in the crystallization of the semiconductor. Accordingly, a bottom gate structure, in which a driving semiconductor is disposed on a driving control electrode, may be used, thereby improving the characteristics of the thin film transistor.

Also, the driving control electrode 124*b* has a thickness between about 10 nanometers to about 500 nanometers, specifically about 50 nanometers to about 200 nanometers, more specifically about 60 nanometers to about 100 nanometers. When the driving control electrode 124*b* has a thickness between about 10 nanometers to about 500 nanometers, specifically about 50 nanometers to about 200 nanometers, and more specifically about 60 nanometers to about 100 nanometers, even if the tapered portion of the driving control electrode 124*b* is corroded by a chemical solution, such as an etchant during wet etching, the width of the change thereof is small such that the appearance as the stain may be reduced. Accordingly, deterioration of the display characteristics may be prevented.

A driving gate insulating layer 140*p* is disposed on the driving control electrode 124*b*. The driving gate insulating layer 140*p* may be made of silicon oxide ("$SiO_2$"), and may have a thickness between about 10 nanometers to about 400 nanometers, specifically about 50 nanometers to about 200 nanometers, more specifically about 75 nanometers to about 100 nanometers.

The driving gate insulating layer 140*p* may be surface-treated by using a nitrogen-containing gas, such as ammonia, and it has been observed that about 0.06 atomic percent to about 4.75 atomic percent of the nitrogen, based on the total composition of the driving gate insulating layer 140*p*, may remain on the surface of the driving gate insulating layer 140*p* after the surface treatment. The nitrogen-containing gas can comprise nitrogen, nitrous oxide, nitric oxide, ammonia, or the like, or a combination comprising at least one of the foregoing nitrogen-containing gases.

A driving semiconductor 154*b* overlapping the driving control electrode 124*b* is disposed on the driving gate insulating layer 140*p*. The driving semiconductor 154*b* extends according to the driving control electrode 124*b* and has an island shape, is disposed in the boundary of the driving control electrode 124*b*, and is made of crystallized silicon.

The driving semiconductors 154*b* respectively include doped regions 155*b* and non-doped regions 156*b*. The doped regions 155*b* are disposed on both sides of the central non-doped region 156*b*, and are made of crystalline silicon doped with an n-type impurity or a p-type impurity. The non-doped region 156*b* is made of an intrinsic semiconductor that is not doped with an impurity, and forms the channel of the driving thin film transistor.

A gate line 121 including a switching control electrode 124*a*, a driving voltage line 172 including a driving input electrode 173*b*, and a driving output electrode 175*b* are disposed on the driving semiconductor 154*b* and the driving gate insulating layer 140.

The gate lines 121 substantially extend in the transverse direction and include the switching control electrodes 124*a*, and an end portion 129 for connection with an external driving circuit.

The driving voltage line 172 extends substantially in a transverse direction and substantially parallel to the gate line 121. The driving voltage line 172 includes a driving input electrode 173*b* extending toward the driving semiconductor 154*b*, and a portion of the driving voltage line 172 overlaps the driving control electrode 124*b* to form the storage capacitor Cst.

The driving output electrode 175*b* is separated from the driving voltage line 172, and extends according to the driving semiconductor 154*b* with the island shape.

The driving input electrode 173*b* and the driving output electrode 175*b* are respectively disposed on the doped regions 155*b* of the driving semiconductor 154*b*, and are disposed opposing to each other with respect to the non-doped region 156*b* of the driving semiconductor 154*b*. Here, the driving input electrodes 173*b* and the non-doped regions 156*b*, or the driving output electrodes 175*b* and the non-doped regions 156*b*, are separated from each other by between about 0.5 micrometers to about 7 micrometers, specifically about 1 micrometer to about 3 micrometers, more specifically about 1.5 micrometers to about 2.5 micrometers, and most specifically about 2 micrometers.

The gate line 121, the driving voltage line 172, and the driving output electrode 175*b* may comprise a low resistance metal, such an aluminum-containing metal, aluminum (Al), an aluminum alloy, a silver-containing metal, silver (Ag), a silver alloy, a copper-containing metal, copper (Cu), a copper alloy, or the like, or a combination comprising at least one of the foregoing low resistance metals. The low resistance metal may have a lower melting point than the refractory metal of the switching control electrode 124*a* and the driving control electrode 124*b*.

The signal lines, such as the gate line 121 and the driving voltage line 172, are made of the low resistance metal, such as aluminum, copper, silver, a molybdenum-containing metal including molybdenum, or a molybdenum alloy, thereby preventing the signal delay in an organic light emitting device. Also, the low resistance metal has a relatively low melting point such that the low resistance metal may be melted or thermally-damaged in a high temperature semiconductor crystallization process, such as in the solidification crystallization process. However the gate line 121 and driving voltage line 172 of the low resistance metal are disposed after the semiconductor crystallization process in the present exemplary embodiment such that they are not exposed to the high temperature, thus damage to the signal lines may be prevented.

A switching gate insulating layer 140*q* is disposed on the gate line 121, the driving voltage line 172 and the driving output electrode 175*b*.

The switching gate insulating layer 140*q* may comprise silicon nitride ("$SiN_x$"), and may have a thickness between about 200 nanometers to about 500 nanometers, specifically about 300 nanometers to about 450 nanometers, more specifically about 350 nanometers to about 400 nanometers.

A switching semiconductor 154*a* overlapping the switching control electrode 124*a* is disposed on the switching gate insulating layer 140*q*. The switching semiconductor 154*a* may comprise amorphous silicon and may have a thickness between about 100 nanometers to about 500 nanometers, specifically about 150 nanometers to about 250 nanometers, more specifically about 75 to about 225 nanometers.

A pair of ohmic contacts 163*a* and 165*a* are disposed on the switching semiconductor 154*a*, and a data line 171, including a switching input electrode 173*a*, and a switching output electrode 175*a*, are disposed on the ohmic contact 163*a* and 165*a* and the switching gate insulating layer 140*q*.

A passivation layer 180 is disposed on the data lines 171 and the switching output electrodes 175*a*.

The passivation layer 180 has a plurality of contact holes 183*a* and 182 exposing the switching output electrodes 175*a* and end portions 179 of the data lines 171. The passivation layer 180, and the switching gate insulating layer 140*q*, have a plurality of contact holes 185*b* and 181 exposing the driving output electrode 175*b* and the end portions 129 of the gate lines 121. Also, the passivation layer 180, the switching gate insulating layer 140*q*, and the driving gate insulating layer 140*p* have a plurality of contact holes 183*b* exposing the driving control electrodes 124*b*.

A pixel electrode 191, a connecting member 85, and contact assistants 81 and 82 are disposed on the passivation layer 180.

An organic insulator 361, having a plurality of openings 365, is disposed on the pixel electrode 191 and the connecting member 85, and a plurality of organic light emitting members 370 are disposed in the openings 365.

A common electrode 270 is disposed on the organic light emitting members 370.

The manufacturing method of the organic light emitting device according to the present exemplary embodiment is substantially the same as the manufacturing method of the previously described exemplary embodiment. However, as above-described, the driving control electrode 124*b* comprises a refractory metal, the gate line 121 including the switching control electrode 124*a* is made of the low resistance metal, the driving control electrode 124*b* is first disposed, and the gate line 121, including the switching control electrode 124*a*, is disposed after crystallizing the driving semiconductor 154*b* in the manufacturing process.

Also, the gate line 121, including the switching control electrode 124*a*, and the driving voltage line 172, including the driving input electrode 173*b*, are disposed with one photolithography process such that the number of masks is reduced and the process is simplified.

Exemplary Embodiment 3

Next, an organic light emitting device according to another exemplary embodiment will be described with reference to FIG. 25 and FIG. 27.

Figure 25:
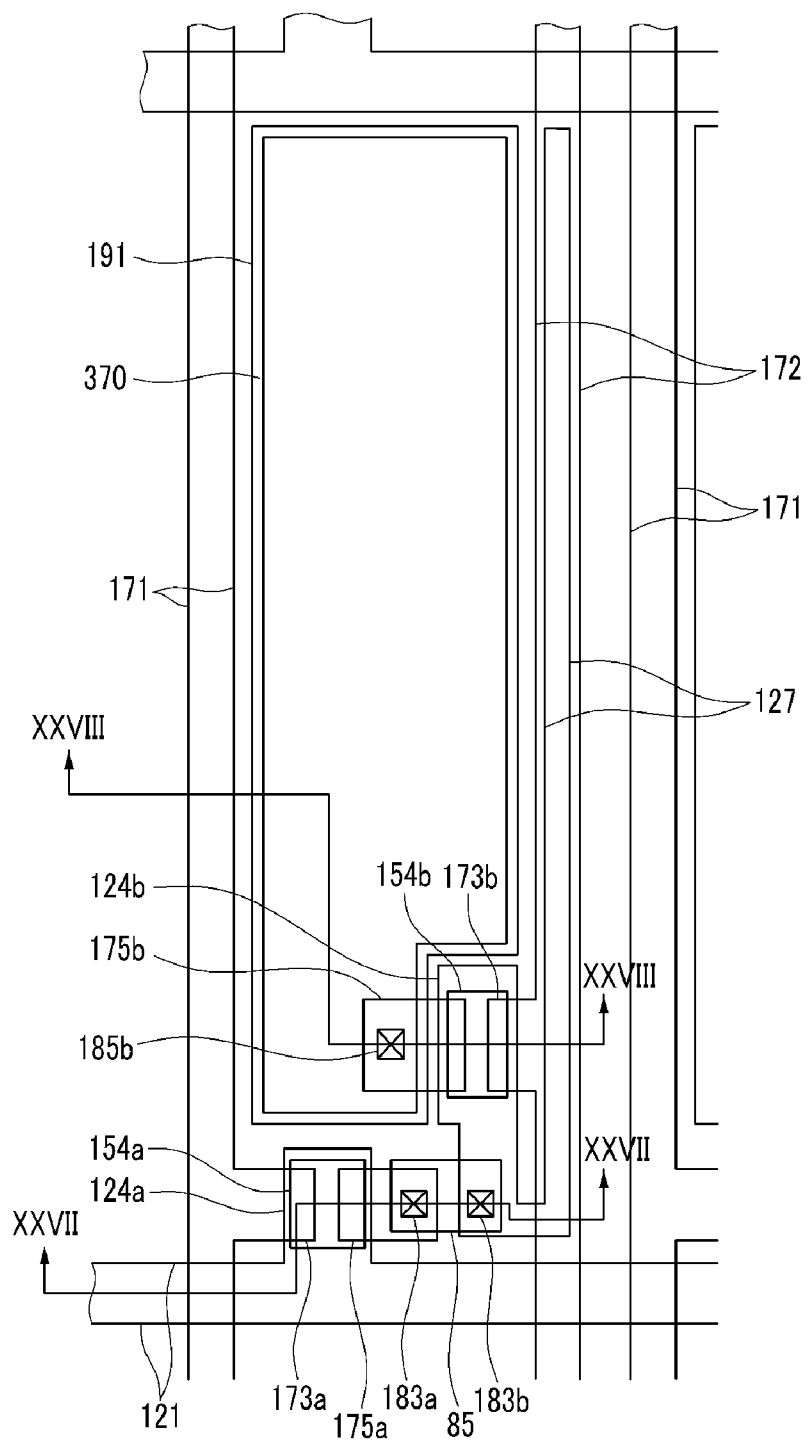
FIG. 25 is a plan view showing an exemplary embodiment of an organic light emitting device.
Figure 26:
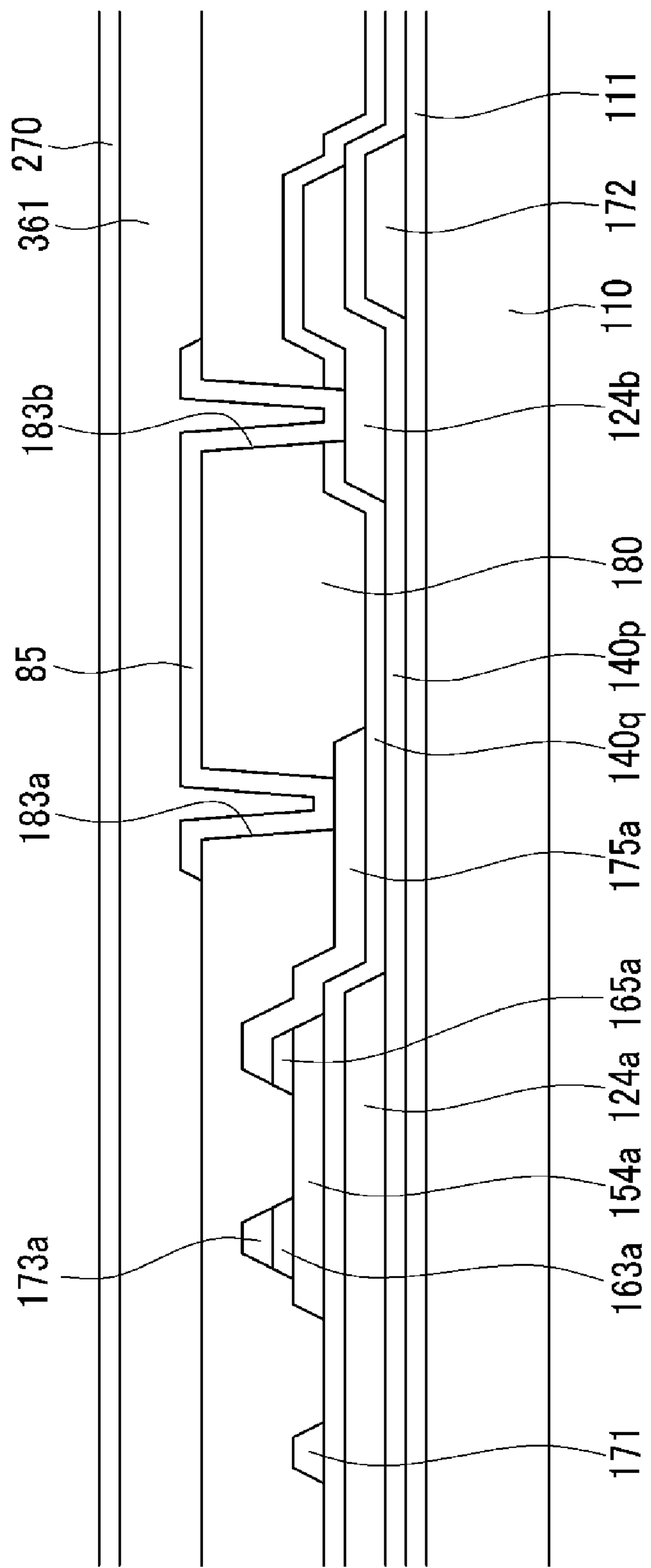
FIG. 26 and FIG. 27 are cross-sectional views showing an exemplary embodiment of the organic light emitting device shown in FIG. 25 taken along the lines XXVI-XXVI and XXVII-XXVII.
Figure 27:
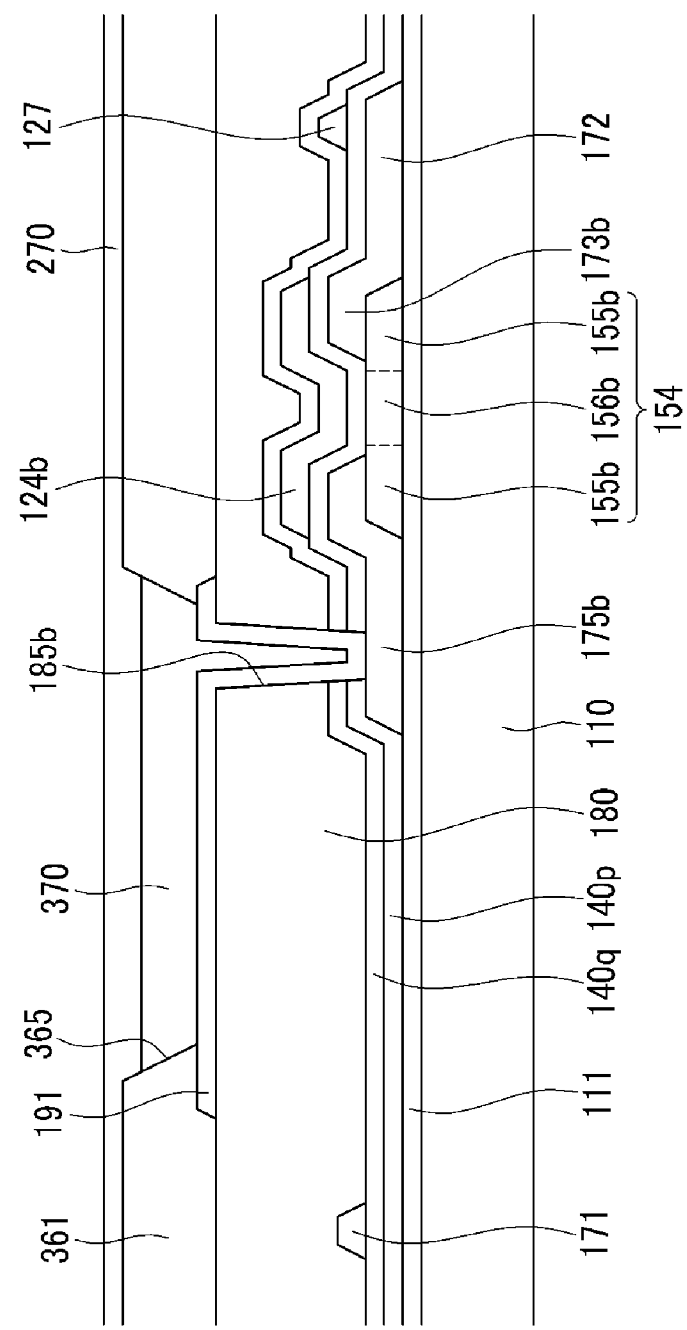

FIG. 25 is a plan view of an organic light emitting device according to another exemplary embodiment, and FIG. 26 and FIG. 27 are cross-sectional views of the organic light emitting device shown in FIG. 25 taken along the lines XXVI-XXVI and XXVII-XXVII.

In the present exemplary embodiment, descriptions of the same elements will be omitted, and the same constituent elements as in the above-described exemplary embodiment are indicated by the same reference numerals.

In the present exemplary embodiment, differently from the above-described exemplary embodiment, the gate electrode of the driving switching element is disposed on the semiconductor.

The detailed deposition structure is described as follows.

A buffer layer 111, specifically which can comprise silicon oxide ("$SiO_2$") is formed on an insulating substrate 110 that comprises a material such as transparent glass or plastic.

A plurality of driving semiconductors 154*b* are disposed on the buffer layer 111. The driving semiconductors 154*b* are comprise microcrystalline silicon, polysilicon, or the like.

The interface between the buffer layer 111 and the driving semiconductors 154*b* is treated by plasma with a nitrogen-containing gas. The nitrogen-containing gas can comprise ammonia gas ("$NH_3$"), for example. It has been observed that the interface between the buffer layer and the driving semiconductor 154*b* comprises between about 0.06 atomic percent to about 4.75 atomic percent of nitrogen, based on the total composition of the buffer layer, based on analysis using XPS (X-ray photoelectron spectroscopy) after the surface treatment. In an embodiment, the interface between the buffer layer and the driving semiconductor 154*b* comprises between 0.01 atomic percent to 10 atomic percent nitrogen, specifically about 0.05 atomic percent to about 5 atomic percent, more specifically about 0.1 atomic percent to about 3 atomic percent nitrogen, based on the total composition of the buffer layer, when analyzed by XPS.

As above-described, the buffer layer 111 is plasma-treated using the nitrogen-containing gas such that the crystallinity of the driving semiconductor 154*b* may be improved. The buffer layer may be plasma-treated by the same process as for the above-described gate insulating layer 140*p*.

The driving semiconductors 154*b* respectively include doped regions 155*b* and non-doped regions 156*b*. The doped regions 155*b* are disposed on both sides of the central non-doped region 156*b*, and are made of crystalline silicon doped with an n-type impurity such as phosphorous (P) or a p-type impurity such as boron (B). The non-doped region 156*b* is made of an intrinsic semiconductor that is not doped with an impurity, and forms the channel of the driving thin film transistor.

A plurality of driving voltage lines 172 including a plurality of driving input electrodes 173*b* and a plurality of driving output electrodes 175*b* are disposed on the driving gate insulating layer 140*p*.

The driving input electrodes 173*b* and the driving output electrodes 175*b* are respectively disposed on the doped regions 155*b* of the driving semiconductors 154*b*, and are opposite to each other with respect to the non-doped regions 156*b* of the driving semiconductors 154*b*. Here, the driving input electrodes 173*b* and the non-doped regions 156*b*, and the driving output electrodes 175*b* and the non-doped regions 156*b*, are separated from each other with a predetermined interval therebetween.

A driving gate insulating layer 140*p* is disposed on the driving semiconductor 154*b*. Like the first exemplary embodiment, the driving gate insulating layer 140*p* may comprise silicon oxide and may be plasma-treated.

A gate line 121, including a switching control electrode 124*a* and a driving control electrode 124*b*, are disposed on the driving gate insulating layer 140*p*.

The gate line 121 intersects the data line 171 and the driving voltage line 172, and includes the switching control electrode 124*a*.

The driving control electrode 124*b* is separated from the gate line 121, and includes a storage electrode 127.

A switching gate insulating layer 140*q* is disposed on the gate line 121 and the driving control electrode 124*b*. The switching gate insulating layer 140*q* may comprise silicon nitride ("$SiN_x$") and may have a thickness of about 200 nanometers to about 500 nanometers, specifically about 300 nanometers to about 450 nanometers, more specifically about 350 nanometers to about 400 nanometers.

A switching semiconductor 154*a* overlapping the switching control electrode 124*a* is disposed on the switching gate insulating layer 140*q*. The switching semiconductor 154*a* may comprise amorphous silicon and may have a thickness between about 100 nanometers to about 500 nanometers, specifically about 150 nanometers to about 250 nanometers, more specifically about 175 nanometers to about 300 nanometers.

A pair of ohmic contacts 163*a* and 165*a* are disposed on the switching semiconductors 154*a*. The ohmic contacts 163*a* and 165*a* can be comprise amorphous silicon doped with an n-type or p-type impurity, and may have a thickness between 10 nanometers to about 200 nanometers, specifically 30 nanometers to about 100 nanometers, more specifically about 50 nanometers.

A data line 171 having a switching input electrode 173*a* overlapping the ohmic contact 163*a*, and a switching output electrode 175*a* opposite to the switching input electrode 173*a* and overlapping the ohmic contact 165*a*, are disposed on the ohmic contacts 163*a* and 165*a*.

A passivation layer 180 is disposed on the data line 171 and the switching output electrode 175*a*. The passivation layer 180 may comprise an inorganic material such as silicon oxide, silicon nitride, or the like, or an organic material such as polyacryl, or the like, and the thickness thereof is between about 0.05 micrometers to about 5 micrometers, specifically about 0.2 micrometers to about 2 micrometers, more specifically about 0.5 micrometers to about 1 micrometer.

The passivation layer 180 has a plurality of contact holes 183*a* exposing the switching output electrodes 175*a*. The passivation layer 180 and the gate insulating layer 140*p* and 140*q* have a plurality of contact holes 185*b* exposing the driving output electrode 175*b*. Also, the passivation layer 180 and the switching gate insulating layer 140*q* have a plurality of contact holes 183*b* and 181 exposing the driving control electrodes 124*b*.

A pixel electrode 191 and a connecting member 85 are disposed on the passivation layer 180.

An organic insulator 361 having an opening 365 is disposed on the pixel electrode 191 and the connecting member 85.

An organic light emitting member 370 is disposed in the opening 365, and a common electrode 270 is disposed on the organic light emitting member 370.

While disclosed embodiments have been described in connection with what is presently considered to be practical exemplary embodiments, it is to be understood by those skilled in the art that various changes can be made and equivalents can be substituted for elements thereof, and that the invention is not limited to the disclosed embodiments and the best mode contemplated, but, on the contrary, is intended to cover various modifications and equivalent arrangements included within the spirit and scope of the appended claims.

What is claimed is:

1. A method for manufacturing an organic light emitting device, the method comprising:

disposing a switching control electrode and a driving control electrode on a substrate;

disposing a driving gate insulating layer on the driving control electrode;

surface-treating the driving gate insulating layer with a nitrogen-containing gas;

disposing a first amorphous silicon layer on the driving gate insulating layer;

crystallizing the first amorphous silicon layer to form a driving semiconductor;

disposing a driving input electrode and a driving output electrode on the driving semiconductor;

disposing a switching gate insulating layer on the driving input electrode, the driving output electrode and the switching control electrode;

disposing a switching semiconductor on the switching gate insulating layer;

disposing a switching input electrode and a switching output electrode on the switching semiconductor;

disposing a pixel electrode electrically connected to the driving output electrode;

disposing an emission layer on the pixel electrode; and disposing a common electrode on the emission layer, wherein a concentration of nitrogen in an interface between the driving gate insulating layer and the driving semiconductor is between about 0.06 atomic percent to about 4.75 atomic percent, based on a total composition of the driving gate insulating layer.

2. The method of claim 1, wherein the driving gate insulating layer comprises silicon oxide.

3. The method of claim 2, wherein the disposing of the driving semiconductor comprises doping at least a portion of the first amorphous silicon layer.

4. The method of claim 3, wherein the doping of the first amorphous silicon layer comprises:

disposing a doping stopper overlapping the driving control electrode on the first amorphous silicon layer; and doping the first amorphous silicon layer with an n-type or p-type impurity, wherein the first amorphous silicon layer is patterned after crystallizing the first amorphous silicon layer.

5. The method of claim 3, wherein the doping of the first amorphous silicon layer comprises:

disposing a doping stopper overlapping the driving control electrode on the first amorphous silicon layer;

doping the first amorphous silicon layer with an n-type or p-type impurity; and patterning the first amorphous silicon layer to form a patterned first amorphous silicon layer, wherein a width of the doping stopper is narrower than a width of the patterned first amorphous silicon layer.

6. The method of claim 5, wherein the first amorphous silicon layer is crystallized by a solidification crystallization process.

7. The method of claim 6, wherein the solidification crystallization process is executed at a temperature between about 650° C. to about 750° C.

8. The method of claim 1, wherein the nitrogen-containing gas comprises ammonia gas.

9. The method of claim 1, wherein the substrate is precompacted.

10. The method of claim 1, wherein the surface-treating the driving gate insulating layer comprises surface-treating the driving gate insulating layer by plasma using an ammonia gas.

11. The method of claim 1, wherein the nitrogen-containing gas comprises nitrogen, nitrous oxide, nitric oxide, ammonia, or a combination comprising at least one of the foregoing nitrogen containing gases.

* * * * *